US012667020B2

(12) United States Patent
Lin et al.

(10) Patent No.: US 12,667,020 B2
(45) Date of Patent: Jun. 23, 2026

(54) HYBRID UNDERFILL STRUCTURES FOR MULTI-DIE PACKAGES AND METHODS OF FORMING THE SAME

(71) Applicant: Taiwan Semiconductor Manufacturing Company Limited, Hsinchu (TW)

(72) Inventors: Wen-Yi Lin, New Taipei City (TW); Kai-Cheng Chen, Taoyuan City (TW); Chien-Li Kuo, Hsinchu City (TW); Chien-Chen Li, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 420 days.

(21) Appl. No.: 18/335,302

(22) Filed: Jun. 15, 2023

(65) Prior Publication Data

US 2024/0421115 A1     Dec. 19, 2024

(51) Int. Cl.
| | |
|---|---|
| *H10W 90/00* | (2026.01) |
| *H10W 72/00* | (2026.01) |
| *H10W 72/30* | (2026.01) |
| *H10W 74/15* | (2026.01) |
| *H10W 90/10* | (2026.01) |

(52) U.S. Cl.
CPC ...... *H10W 90/00* (2026.01); *H10W 72/01271* (2026.01); *H10W 72/072* (2026.01); *H10W 72/07211* (2026.01); *H10W 72/07232* (2026.01); *H10W 72/324* (2026.01); *H10W 72/327* (2026.01); *H10W 72/853* (2026.01);

*H10W 74/15* (2026.01); *H10W 90/10* (2026.01); *H10W 90/724* (2026.01); *H10W 90/734* (2026.01)

(58) Field of Classification Search
CPC ........ H10W 90/00; H01L 24/30; H01L 24/16; H01L 24/24
See application file for complete search history.

(56) References Cited

U.S. PATENT DOCUMENTS

| | | | |
|---|---|---|---|
| 2022/0013496 A1* | 1/2022 | Park | ......................... H01L 23/16 |
| 2022/0189835 A1* | 6/2022 | Yim | .................... H01L 23/5384 |

* cited by examiner

*Primary Examiner* — Errol V Fernandes
(74) *Attorney, Agent, or Firm* — The Marbury Law Group, PLLC

(57) ABSTRACT

An embodiment semiconductor package includes a package substrate, a first semiconductor die electrically and mechanically coupled to the package substrate, a second semiconductor die electrically and mechanically coupled to the package substrate, a non-conductive film formed between the first semiconductor die and the package substrate, and a capillary underfill material formed between the second semiconductor die and the package substrate. The non-conductive film may be formed in a first region over a surface of the package substrate and the capillary underfill material may be formed over a second region of the surface of the package substrate, such that the second region surrounds the first region in a plan view. The semiconductor package may further include a multi-die frame partially surrounding the first semiconductor die and the second semiconductor die such that a multi-die chip is formed that includes the first semiconductor die, the second semiconductor die, and the multi-die frame.

20 Claims, 18 Drawing Sheets

400a

200

104

120

122    210

202

108

128

210

210

210

210

204

206

208

110

124

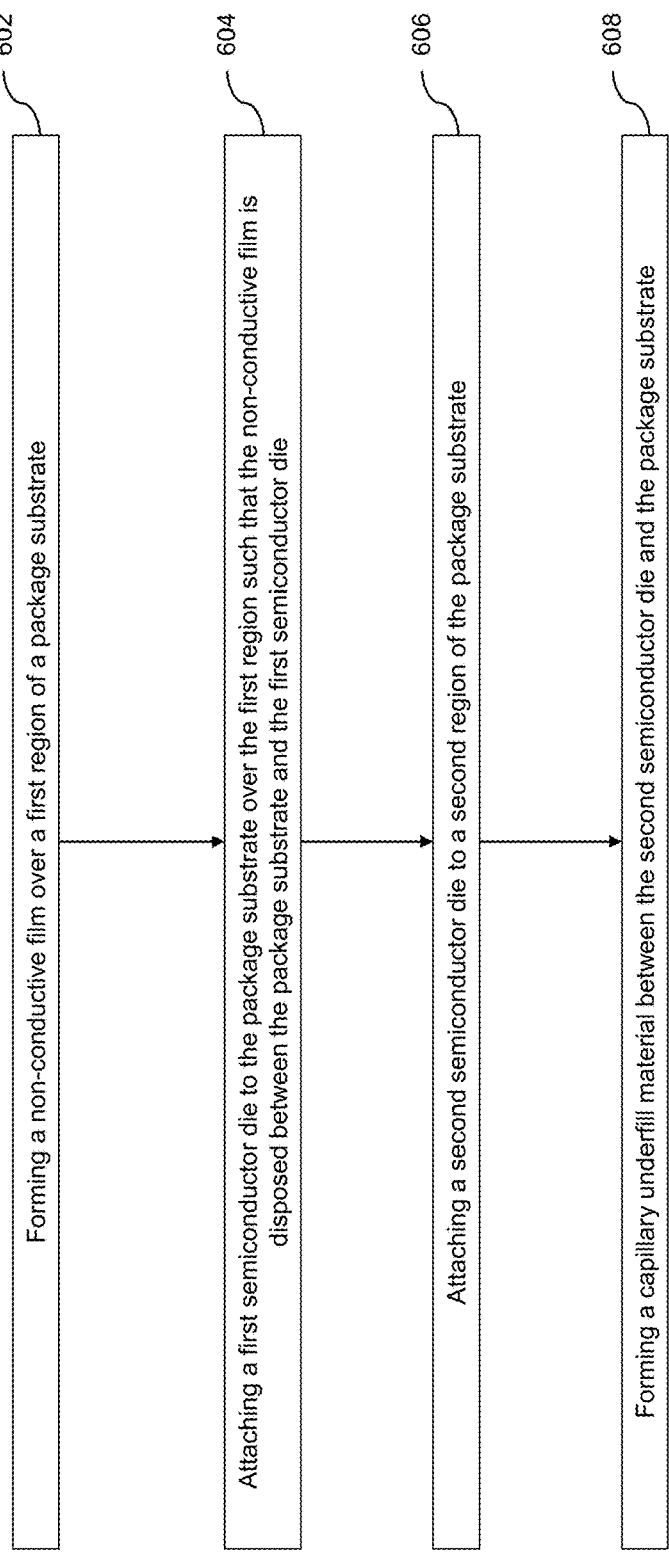

602

Forming a non-conductive film over a first region of a package substrate

604

Attaching a first semiconductor die to the package substrate over the first region such that the non-conductive film is disposed between the package substrate and the first semiconductor die

606

Attaching a second semiconductor die to a second region of the package substrate

608

Forming a capillary underfill material between the second semiconductor die and the package substrate

HYBRID UNDERFILL STRUCTURES FOR MULTI-DIE PACKAGES AND METHODS OF FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens, hundreds, or thousands of integrated circuits may be manufactured on a single semiconductor wafer, and individual dies on the wafer may be singulated by sawing between the integrated circuits along scribe lines. The individual dies may be packaged separately, in multichip modules, for example, or in other types of packaging.

As semiconductor packages have become more complex, package sizes have tended to become larger to accommodate greater numbers of integrated circuits and/or dies per package. These larger and more complex semiconductor packages have led to additional challenges in making effective and reliable electrical interconnections within the semiconductor package. Other challenges includes mechanical issues related to coefficient of thermal expansion (CTE) mismatch between package components leading to warpage, cracking, delamination, etc.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart illustrating various operations of a method of forming a semiconductor package, according to various embodiments.

DETAILED DESCRIPTION

Figure 1A:
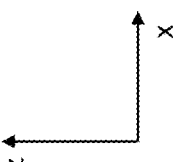
FIG. 1A is vertical cross-sectional exploded view of components of a semiconductor package during a package assembly and surface mounting process.

The following disclosure provides many different embodiments, or examples, for implementing different features of the provided subject matter. Specific examples of components and arrangements are described below to simplify this disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, this disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Generally, in a semiconductor package, one or more semiconductor integrated circuit (IC) dies may be mounted onto a common substrate, which may also be referred to as a "package substrate." In some embodiments, electrical connections to the semiconductor package may be made by mounting the package substrate onto a support substrate containing electrical interconnects, such as a printed circuit board (PCB). A semiconductor die or multi-die chip may be attached to a package substrate using a mass reflow process to melt solder portions that may then re-solidify to form metallurgical bonds between respective electrical bonding structures on the semiconductor die (or multi-die chip) and the package substrate. A cleaning fluid may be introduced to remove flux, used in the mass reflow process, which may remain between the semiconductor die (or multi-die chip) and the package substrate. A capillary underflow material may then be introduced in spaces between the semiconductor die (or multi-die chip) and the package substrate to protect bonding structures from thermally-induced stresses/strains.

In larger semiconductor packages that include fine-pitch interconnects, however, limited capillary flow may lead to a reduced efficiency of the flux cleaning process as well as a reduced ability for the capillary underfill material to completely fill narrow spaces between the semiconductor die and the package substrate, which may lead to flux residue and voids in the capillary underflow material. Remaining flux residue may have a corrosive effect that may damage electrical bonding structures and the presence of voids may reduce an ability of the capillary underfill material to effectively protect the bonding structures from thermal stresses/strains.

The various embodiments disclosed herein may provide improved methods for assembling semiconductor packages that may mitigate mechanical issues related to thermal expansion mismatch between package components that may otherwise cause warpage, cracking, delamination, etc. In this regard, disclosed embodiments provide a hybrid underfill structure that includes a non-conductive film in a central region between a semiconductor die (or multi-die chip) and a package substrate and a capillary underfill material that surrounds the non-conductive film in a plan view. The non-conductive film may be placed on a surface of the package substrate prior to attaching the semiconductor die (or multi-die chip) to the package substrate. The presence of the non-conductive film in the central region may reduce a volume occupied by the capillary underfill material in a surrounding region. Thus, a capillary-flow distance may be reduced leading to more efficient cleaning of flux residue and more efficient placement of the capillary underflow material. As such, the occurrence of flux residue and voids between the semiconductor die (or multi-die chip) and the package substrate may be reduced or eliminated leading to improved device performance in terms of increased protection of electrical bonding structures.

An embodiment semiconductor package may include a package substrate, a first semiconductor die electrically and mechanically coupled to the package substrate, a second semiconductor die electrically and mechanically coupled to the package substrate, a non-conductive film formed between the first semiconductor die and the package substrate, and a capillary underfill material formed between the second semiconductor die and the package substrate. The non-conductive film may be formed in a first region over a surface of the package substrate and the capillary underfill material may be formed over a second region of the surface of the package substrate, such that the second region surrounds the first region in a plan view. The semiconductor package may further include a multi-die frame partially surrounding the first semiconductor die and the second semiconductor die such that a multi-die chip is formed that includes the first semiconductor die, the second semiconductor die, and the multi-die frame.

A further embodiment semiconductor package may include a package substrate, a multi-die chip attached to the package substrate, a non-conductive film formed in a first region between the multi-die chip and the package substrate, and a capillary underfill material formed in a second region between the multi-die chip and the package substrate. The capillary underfill material may surround the first region in a plan view and may have a second width that is at least 20% greater than a first width of the non-conductive film. The capillary underfill material may further have a second area that is at least 50% greater than a first area of the non-conductive film. In various embodiments, the multi-die chip may have a chip width that is greater than or equal to 50 mm and bonding structures having a pitch that is less than or equal to 300 microns. In some embodiments, the package substrate may have a package width that is greater than or equal to 72 mm.

An embodiment method of forming a semiconductor package may include forming a non-conductive film over a first region of a package substrate; attaching a first semiconductor die to the package substrate over the first region such that the non-conductive film is disposed between the package substrate and the first semiconductor die; attaching a second semiconductor die to a second region of the package substrate; and forming a capillary underfill material between the second semiconductor die and the package substrate. The operations of attaching the first semiconductor die to the package substrate and attaching the second semiconductor die to the package substrate may further include placing the first semiconductor die over the first region of the package substrate; placing the second semiconductor die over the second region of the package substrate; and performing a thermocompression bonding process to couple the first semiconductor die and the second semiconductor die electrically and mechanically to the package substrate.

Figure 1B:
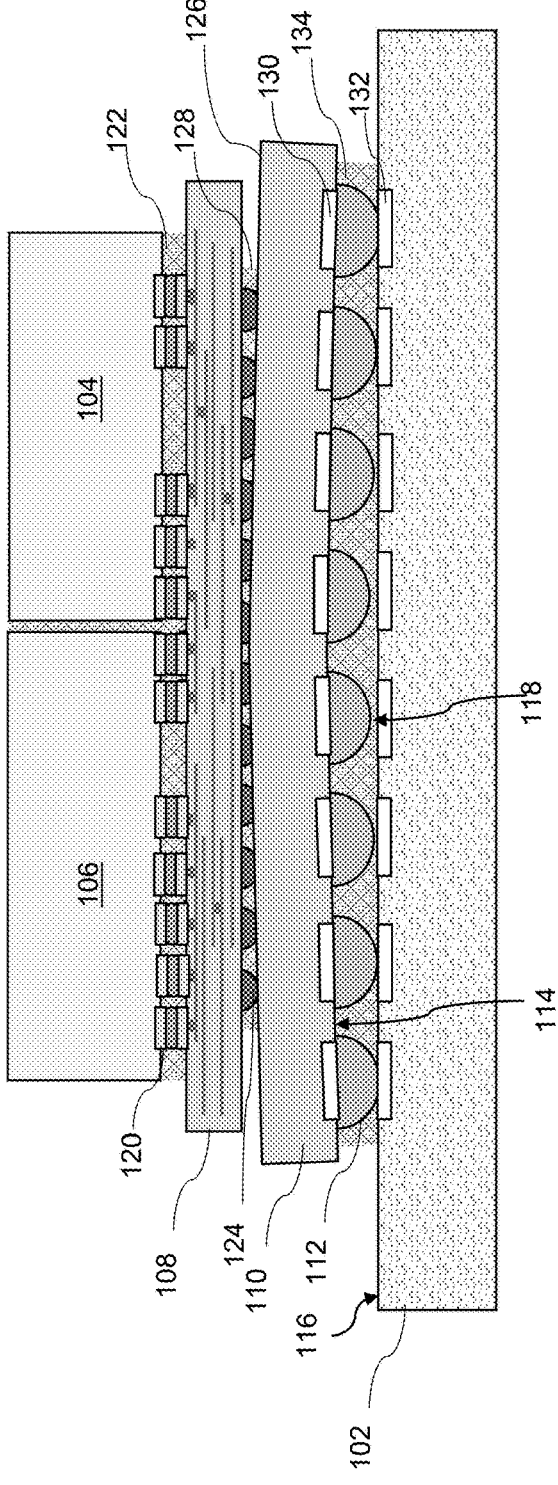
FIG. 1B is a vertical cross-sectional view illustrating an assembled semiconductor package mounted onto a surface of a support substrate.
Figure 1B:
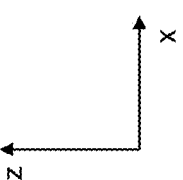

FIG. 1A is vertical cross-sectional exploded view of components of a semiconductor package 100 during a package assembly and surface mounting process. FIG. 1B is a vertical cross-sectional view illustrating the assembled semiconductor package 100 mounted onto the surface of a support substrate 102, such as a printed circuit board (PCB). The semiconductor package 100 in this example is a chip-on-wafer-on-substrate (CoWoS)® semiconductor package, although it will be understood that a similar assembly and mounting process may be utilized for other types of semiconductor packages, such as integrated fan-out (InFO) semiconductor packages, flip-chip semiconductor packages, etc.

Referring to FIGS. 1A and 1B, the semiconductor package may include integrated circuit (IC) semiconductor devices, such as first semiconductor dies 104 and second semiconductor dies 106. During the package assembly process, the first semiconductor die 104 and the second semiconductor die 106 may be mounted on an interposer 108, and the interposer 108 containing the first semiconductor die 104 and the second semiconductor die 106 may be mounted onto a package substrate 110 to form a semiconductor package 100. The semiconductor package 100 may then be mounted to a support substrate 102, such as a printed circuit board (PCB), by mounting the package substrate 110 to the support substrate 102 using an array of solder balls 112 on the lower surface 114 of the package substrate 110.

A parameter that may ensure proper interconnection between the package substrate 110 and the support substrate 102 is the degree of co-planarity between the surfaces of the solder balls 112 that may be brought into contact with the mounting surface (i.e., the upper surface 116 of the support substrate 102 in FIG. 1A). A low degree of co-planarity between the solder balls 112 may result in instances of solder cold joints (i.e., insufficient melting of the solder material, resulting in a poor bond that is susceptible to cracking and separation) and/or solder bridging issues (i.e., solder material from one solder ball 112 contacting material from a neighboring solder ball 112, resulting in an unintended connection (i.e., electrical short)) during the reflow process.

Deformation of the package substrate 110, such as stress-induced warping of the package substrate 110, may be a contributor to low co-planarity of the solder balls 112 during surface mounting of the package substrate 110 onto a support substrate 102. FIG. 1B illustrates a package substrate 110 that includes a warpage deformation. The warp deformation of the package substrate 110 may result in variations of the distance between the lower surface 114 of the package substrate 110 and the upper surface 116 support substrate 102. Such deformation of the package substrate 110 may increase the risk of defective solder connections with the underlying support substrate 102. As shown in FIG. 1B, for example, a deformation of the package substrate 110 may cause at least some of the solder joints between the package substrate 110 and the support substrate 102 to fail completely, as indicated by the arrow 118 in FIG. 1B. In the exemplary embodiment shown in FIG. 1B, the deformation of the package substrate 110 may have a bow-shape or cup-shape such that a separation between the lower surface 114 of the package substrate 110 and the upper surface 116 of the support substrate 102 may be smallest at the periphery of the package substrate 110 and may increase towards the center of the package substrate 110.

Deformation of the package substrate 110 is not an uncommon occurrence, particularly in the case of semiconductor packages used in high-performance computing applications. These high-performance semiconductor packages 100 tend to be relatively large and may include a number of semiconductor dies (e.g., 104, 106) mounted to the package substrate 110, which may increase a likelihood that the package substrate 110 may be subject to warping or other deformations. Such deformations may present challenges to effective solder mounting of these types of package substrates 110 onto a support substrate 102.

In various embodiments, the first semiconductor dies 104 may be three-dimensional devices, such as three-dimensional integrated circuits (3DICs), system-on-chip (SoC), or system on integrated chips (SoIC) devices. A three-dimensional semiconductor die 104 may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, a first three-dimensional semiconductor die 104 may also be referred to as a "first die stack."

The second semiconductor die(s) 106 may be different from the first semiconductor die(s) 104 in terms of their structure, design and/or functionality. The one or more second semiconductor dies 106 may be three-dimensional semiconductor dies, which may also be referred to as "second die stacks." In some embodiments, the one or more second semiconductor dies 106 may include a memory device, such as a high bandwidth memory (HBM) device. In the example shown in FIGS. 1A and 1B, the semiconductor package 100 may include a SOC die stack 104 and an HBM die stack 106, although it will be understood that the semiconductor package 100 may include greater or fewer numbers of semiconductor dies.

Referring again to FIG. 1B, the first semiconductor dies 104 and second semiconductor dies 106 may be mounted on an interposer 108. In some embodiments, the interposer 108 may be an organic interposer including a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer 108 are within the contemplated scope of the disclosure. The interposer 108 may include a plurality of conductive bonding pads on upper and lower surfaces of the interposer and a plurality of conductive interconnects extending through the interposer 108 between the upper and lower bonding pads of the interposer 108. The conductive interconnects may distribute and route electrical signals between the first semiconductor dies 104, the second semiconductor dies 106, and the underlying package substrate 110.

A plurality of metal bumps 120, such as microbumps, may electrically connect conductive bonding pads on the bottom surfaces of the first semiconductor dies 104 and second semiconductor dies 106 to the conductive bonding pads on the upper surface of the interposer 108. In one non-limiting embodiment, metal bumps 120 in the form of microbumps may include a plurality of first metal stacks, such as a plurality of Cu—Ni—Cu stacks, located on the bottom surfaces of the first semiconductor dies 104 and second semiconductor dies 106, and a plurality of second metal stacks (e.g., Cu—Ni—Cu stacks) located on the upper surface of the interposer 108. A solder material, such as tin (Sn), may be located between respective first and second metal stacks to electrically connect the first semiconductor dies 104 and the second semiconductor dies 106 to the interposer 108. Other suitable materials for the metal bumps 120 are within the contemplated scope of disclosure.

After the first semiconductor dies 104 and second semiconductor dies 106 are mounted to the interposer 108, a first underfill material portion 122 may optionally be provided in the spaces surrounding the metal bumps 120 and between the bottom surfaces of the first semiconductor dies 104, the second semiconductor dies 106, and the upper surface of the interposer 108 as shown in FIG. 1B. The first underfill material portion 122 may also be provided in the spaces laterally separating adjacent first semiconductor dies 104 and second semiconductor dies 106 of the semiconductor package 100. In various embodiments, the first underfill material portion 122 may include an epoxy-based material, which may include a composite of resin and filler materials.

Referring again to FIG. 1B, the interposer 108 may be mounted on the package substrate 110 that may provide mechanical support for the interposer 108 and the first semiconductor dies 104 and second semiconductor dies 106 that are mounted on the interposer 108. The package substrate 110 may include a suitable material, such as an organic material (e.g., a polymer and/or thermoplastic material), a semiconductor material (e.g., a semiconductor wafer, such as a silicon wafer), a ceramic material, a glass material, combinations thereof, etc. Other suitable substrate materials are within the contemplated scope of present disclosure. In various embodiments, the package substrate 110 may include a plurality of conductive bonding pads (not shown) in an upper surface 126 of the package substrate 110. A plurality of metal bumps 124, such as C4 solder bumps, may electrically connect conductive bonding pads (not shown) on the bottom surface of the interposer 108 to the conductive bonding pads on the upper surface 126 of the package substrate 110. In various embodiments, the metal bumps 124 may include a suitable solder material, such as tin (Sn), although other suitable solder materials are within the contemplated scope of disclosure.

A second underfill material portion 128 may be provided in the spaces surrounding the metal bumps 124 and between the bottom surface of the interposer 108 and the upper surface 126 of the package substrate 110 as illustrated, for example, in FIG. 1B. In various embodiments, the second underfill material portion 128 may include an epoxy-based material, which may include a composite of resin and filler materials. In some embodiments, a lid or cover (not shown in FIGS. 1A and 1B) may be mounted to the package substrate 110 and may provide an enclosure around the upper and side surfaces of the first semiconductor dies 104 and second semiconductor dies 106.

As described above, the package substrate 110 may be mounted to the support substrate 102, such as a printed circuit board (PCB). Other suitable support substrates 102 are within the contemplated scope of disclosure. The package substrate 110 may include a plurality of conductive bonding pads 130 in a lower surface 114 of the package substrate 110. A plurality of conductive interconnects (not shown) may extend through the package substrate 110 between conductive bonding pads on the upper surface 126 and lower surface 114 of the package substrate 110. The plurality of solder balls (or bump structures) 112 may electrically connect the conductive bonding pads 130 on the lower surface 114 of the package substrate 110 to a plurality of conductive bonding pads 132 on the upper surface 116 of the support substrate 102.

The conductive bonding pads 130 of the package substrate 110 and conductive bonding pads 132 of the support substrate 102 may be formed of a suitable conductive material, such as copper. Other suitable conductive materials are within the contemplated scope of disclosure. The plurality of solder balls 112 on the lower surface 114 of the package substrate 110 may form an array of solder balls 112, such as a ball grid array (BGA) that may include an array pattern that corresponds to an array pattern of the conductive bonding pads 132 on the upper surface 116 of the support substrate 102. In one non-limiting example, the array of solder balls 112 may include a grid pattern and may have a pitch (i.e., distance between the center of each solder ball 112 and the center of each adjacent solder ball 112). In an example embodiment, the pitch may be between about 0.8 and 1.0 mm, although larger and smaller pitches may be used. The solder balls 112 may include any suitable solder material, such as tin, lead, silver, indium, zinc, nickel, bismuth, antimony, cobalt, copper, germanium, alloys thereof, combinations thereof, or the like. Other suitable materials for the solder balls 112 are within the contemplated scope of disclosure.

In some embodiments, the lower surface 114 of the package substrate 110 may include a coating of solder resist (SR) material (not shown), which may also be referred to as a "solder mask". A SR material coating may provide a protective coating for the package substrate 110 and any underlying circuit patterns formed on or within the package substrate 110. An SR material coating may also inhibit solder material from adhering to the lower surface 114 of the package substrate 110 during a reflow process. In embodiments in which the lower surface 114 of the package substrate 110 includes an SR coating, the SR material coating may include a plurality of openings through which the conductive bonding pads 130 may be exposed.

In various embodiments, each of the conductive bonding pads 130 in different regions of the package substrate 110 may have the same size and shape. In the embodiment shown in FIGS. 1A and 1B, the surfaces of the conductive bonding pads 130 may be substantially co-planar with the lower surface 114 of the package substrate 110, which in some embodiments may include a solder resist (SR) coating. Alternatively, the surfaces of the conductive bonding pads 130 may be recessed relative to the lower surface 114 of the package substrate 110. In some embodiments, the surfaces of the conductive bonding pads 130 may be raised relative to the lower surface 114 of the package substrate 110.

Referring again to FIGS. 1A and 1B, solder balls 112 may be provided over the respective conductive bonding pads 130. In one non-limiting example, the conductive bonding pads 130 may have a width dimension that is between about 500 μm and about 550 μm (e.g., ~530 μm), and the solder balls 112 may have an outer diameter that may be between about 600 μm and about 650 μm (e.g., ~630 μm), although greater and lesser dimensions for the solder balls 112 and/or the conductive bonding pads 130 are within the contemplated scope of disclosure.

A first solder reflow process may include subjecting the package substrate 110 to an elevated temperature (e.g., at least about 250° C.) to melt the solder balls 112 and cause the solder balls 112 to adhere to the conductive bonding pads 130. Following the first reflow process, the package substrate 110 may be cooled causing the solder balls 112 to re-solidify. Following the first solder reflow process, the solder balls 112 may adhere to the conductive bonding pads 130. Each solder ball 112 may extend from the lower surface 114 of the package substrate 110 by a vertical height that may be less than the outer diameter of the solder ball 112 prior to the first reflow process. For example, where the outer diameter of the solder ball 112 is between about 600 μm and about 650 μm (e.g., ~630 μm), the vertical height of the solder ball 112 following the first reflow process may be between about 500 μm and about 550 μm (e.g., ~520 μm).

In various embodiments, the process of mounting the package substrate 110 onto the support substrate 102 as shown in FIG. 1B, may include aligning the package substrate 110 over the support substrate 102, such that the solder balls 112 contacting the conductive bonding pads 130 of the package substrate 110 may be located over corresponding bonding pads (e.g., conductive bonding pads 132) on the support substrate 102. A second solder reflow process may then be performed. The second solder reflow process may include subjecting the package substrate 110 to an elevated temperature (e.g., at least about 250° C.) to thereby melt the solder balls 112 and cause the solder balls 112 to adhere to the corresponding conductive bonding pads 132 on the support substrate 102. Surface tension may cause the semi-liquid solder to maintain the package substrate 110 in alignment with the support substrate 102 while the solder material cools and solidifies. Upon solidification of the solder balls 112, the package substrate 110 may sit above the upper surface 116 of the support substrate 102 by a stand-off height that may be between about 0.4 mm to about 0.5 mm, although greater or lesser stand-of heights are within the contemplated scope of disclosure.

Following the mounting of the package substrate 110 to the support substrate 102, a third underfill material portion 134 may be provided in the spaces surrounding the solder balls 112 and between the lower surface 114 of the package substrate 110 and the upper surface 116 of the support substrate 102, as is shown in FIG. 1B. In various embodiments, the third underfill material portion 134 may include an epoxy-based material, which may include a composite of resin and filler materials.

Figure 2A:
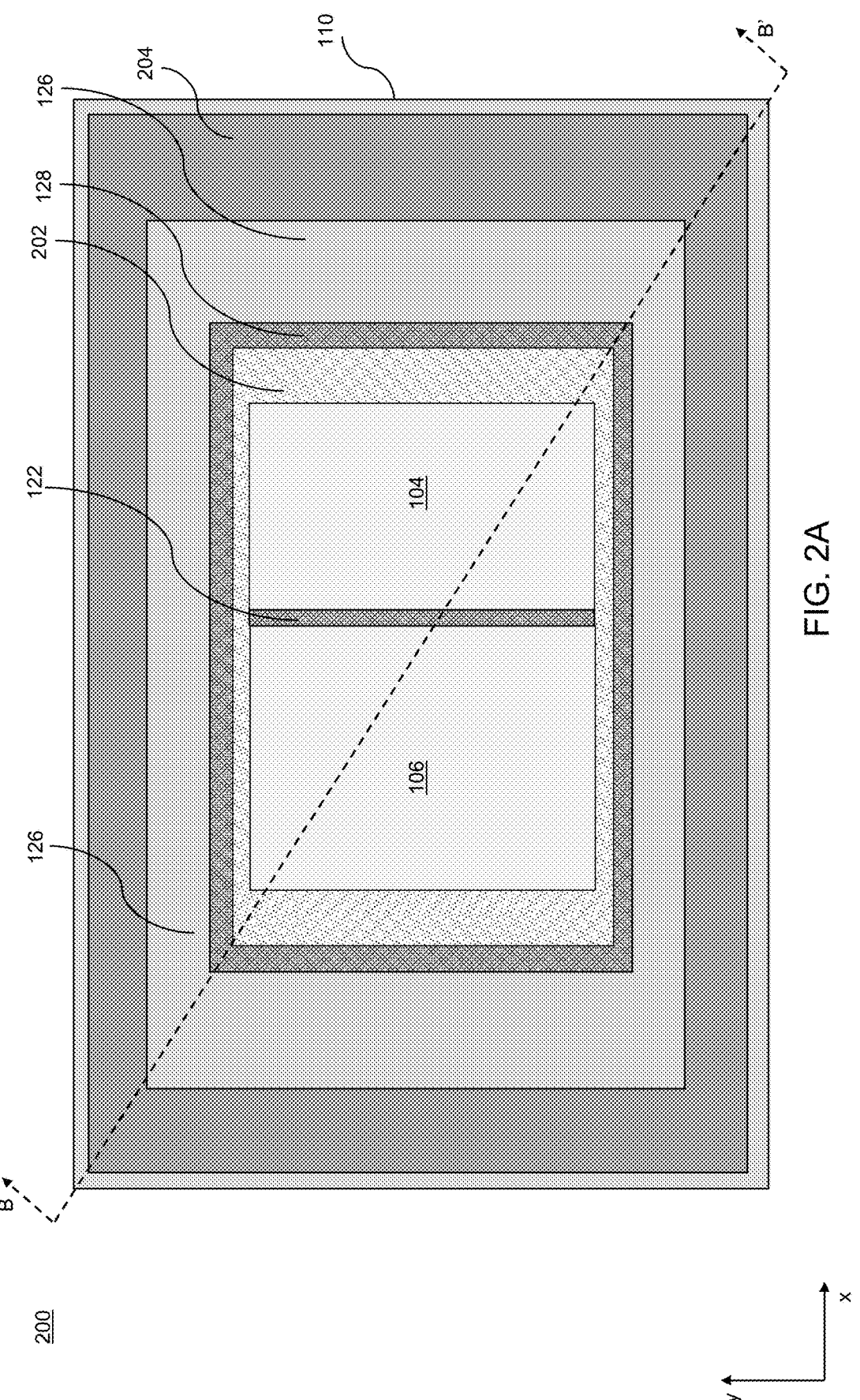
FIG. 2A is a top view of a semiconductor package including an external reinforcement structure.

FIG. 2A is a top view of a semiconductor package 200 including an external reinforcement structure 204, which may be provided to reduce or eliminate the warpage distortion of the package substrate 110 shown in FIG. 1B. The dashed line labeled B-B' indicates the cross-sectional view of the semiconductor package 200 shown in FIG. 2B, as described in greater detail, below. The semiconductor package 200 may be similar to the semiconductor package 100 of FIGS. 1A and 1B. In this regard, the semiconductor package 200 may include a first semiconductor die 104 and a second semiconductor die 106 mounted to an interposer 108 (e.g., see FIG. 2B). The interposer 108 may be mounted to a package substrate 110, as described above with reference to FIGS. 1A and 1B. The semiconductor package 200 may include a first underfill material portion 122 provided in the spaces laterally separating the adjacent first semiconductor die 104 and second semiconductor die 106 of the semiconductor package 200. The semiconductor package 200 may also include a second underfill material portion 128 may be provided in the spaces surrounding the metal bumps 124 and between the bottom surface of the interposer 108 and the upper surface 126 of the package substrate 110 as illustrated, for example, in FIG. 2B.

The semiconductor package 200 may further include an epoxy molding compound (EMC) that may be applied to gaps formed between the interposer 108, the first semiconductor die 104, and the second semiconductor die 106, to thereby form a multi-die EMC frame 202. The EMC material may include an epoxy-containing compound that may be hardened (i.e., cured) to provide a dielectric material portion having sufficient stiffness and mechanical strength. The EMC material may include epoxy resin, hardener, silica (as a filler material), and other additives. The EMC material may be provided in a liquid form or in a solid form depending on the viscosity and flowability.

Liquid EMC may provide better handling, good flowability, fewer voids, better fill, and fewer flow marks. Solid EMC may provide less cure shrinkage, better stand-off, and less die drift. A high filler content (such as 85% in weight) within an EMC material may shorten the time in mold, lower the mold shrinkage, and reduce the mold warpage. A uniform filler size distribution in the EMC material may reduce flow marks and may enhance flowability. The curing temperature of the EMC material may be in a range from 125° C. to 150° C. The multi-die EMC frame 202 may be cured at a curing temperature to form an EMC matrix that laterally encloses each of the first semiconductor die 104 and the second semiconductor die 106. Excess portions of the multi-die EMC frame 202 may be removed from above the horizontal plane including the top surfaces of the semiconductor dies (104, 106) by a planarization process, such as CMP.

Figure 2B:
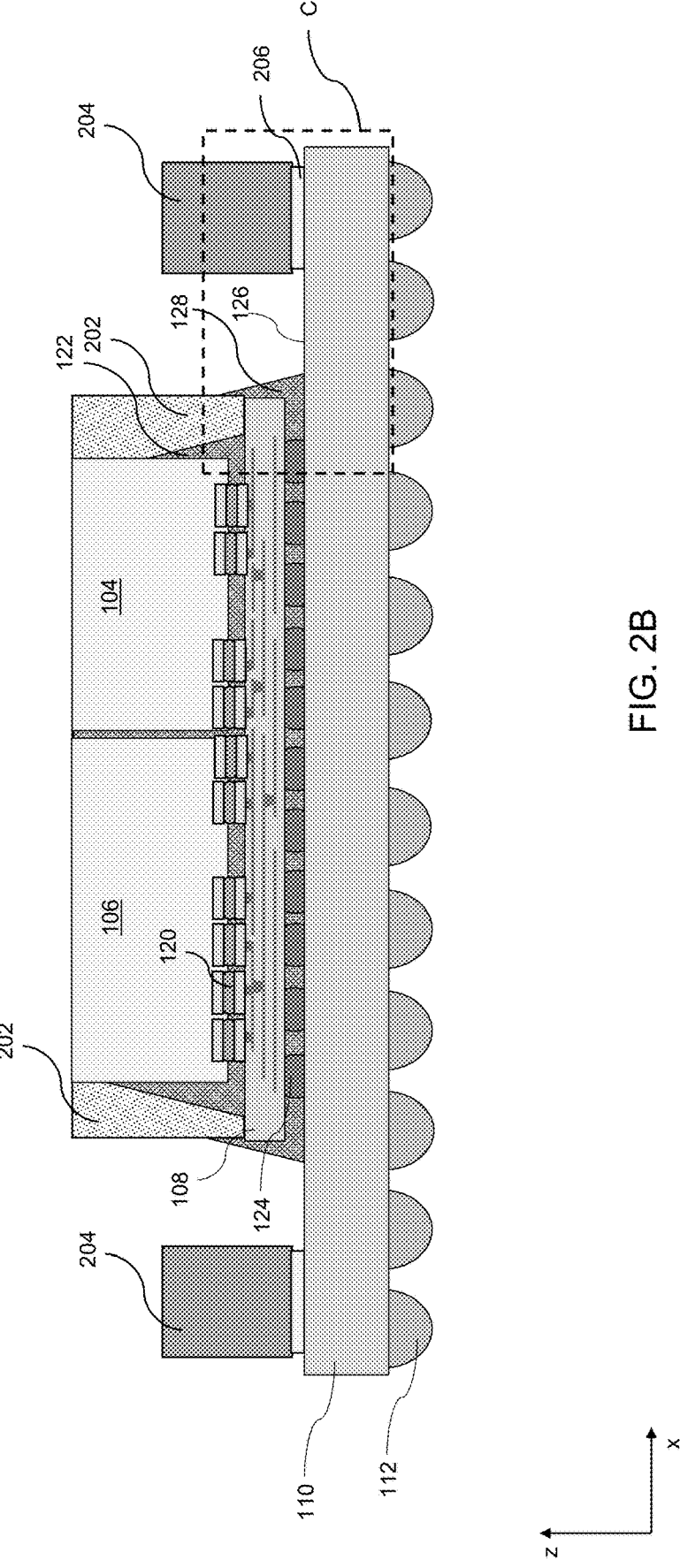
FIG. 2B is a vertical cross-sectional view of the semiconductor package of FIG. 2A.

FIG. 2B is a cross-sectional view of the semiconductor package 200 of FIG. 2A. The external reinforcement structure 204 may be attached to the package substrate 110 with an adhesive 206 and may be formed of a metal, an insulator, a semiconductor, a ceramic, etc. For example, in one embodiment, the external reinforcement structure 204 may include copper at an atomic percentage greater than 80%, such as greater than 90%, greater than 95%, greater than 99%, etc. In other embodiments greater or lesser percentages may be used. As shown in FIG. 2A, the external reinforcement structure 204 may be configured as a ring located around a periphery of the package substrate 110. As such, the external reinforcement structure 204 may form a single structure. Alternatively, the external reinforcement structure 204 may include several disconnected portions (not shown). Further, the external reinforcement structure 204 need not be located near the periphery of the package substrate 110. Rather, the external reinforcement structure 204 may be located on the package substrate 110 in any region that may be subject to mechanical distortions such as warping.

The external reinforcement structure 204 may provide increased mechanical support to the package substrate 110 to thereby reduce or eliminate mechanical distortions such as the warping of the package substrate 110 described above and illustrated, for example, in FIG. 1B. The external reinforcement structure 204 may therefore be chosen to have a mechanical strength (e.g., modulus) that is greater than that of the package substrate 110. As described above, the package substrate 110 may include an organic material (e.g., a polymer and/or thermoplastic material), a semiconductor material (e.g., a semiconductor wafer, such as a silicon wafer), a ceramic material, a glass material, combinations thereof, etc. As such, the choice of material for the external reinforcement structure 204 may be chosen based on the mechanical properties of the package substrate 110. As shown in FIG. 2B, for example, the presence of the external reinforcement structure 204 may reduce or eliminate the warpage distortion of the package substrate 110 shown in FIG. 1B. However, the presence of the external reinforcement structure 204 may give rise to other mechanical issues as described in greater detail with reference to FIG. 2C, below.

Figure 2C:
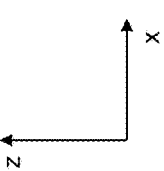
FIG. 2C is a vertical cross-sectional view of an enlarged portion of the semiconductor package of FIG. 2B.

FIG. 2C is a cross-sectional view of an enlarged portion of the semiconductor package of FIG. 2B. The region shown in FIG. 2C is illustrated in the dashed rectangle labeled C in FIG. 2B. For certain material compositions, there may be a mismatch in thermal expansion coefficients of components of the semiconductor package 200 relative to a thermal expansion coefficient of the external reinforcement structure 204. As such, thermal expansion stresses may develop during thermal cycling. Such thermal stresses may lead to mechanical degradation of the semiconductor package 200. For example, as shown in FIG. 2C, cracks 210 may develop in the first underfill material portion 122, in the second underfill material portion 128, at interfaces, within the metal bumps 124, etc. Further, one or both of the first underfill material portion 122 and the second underfill material portion 128 may become delaminated (not shown) from the package substrate 110 and/or from the interposer 108.

In various disclosed embodiments, one or more additional reinforcement structures (not shown) may be provided to compensate the thermal stresses developed between components of the semiconductor package 200 and the external reinforcement structure 204. For example, in some embodiments, a package reinforcement structure (not shown) may be formed within the package substrate 110 (e.g., within region 208 in FIG. 2C). Alternatively, other methods of forming semiconductor packages may mitigate the above-described issues related to mechanical deformation/degradation that may arise due to thermally-induced stresses/ strains, as described in greater detail with reference to FIGS. 4A to 5H, below.

Figure 3A:
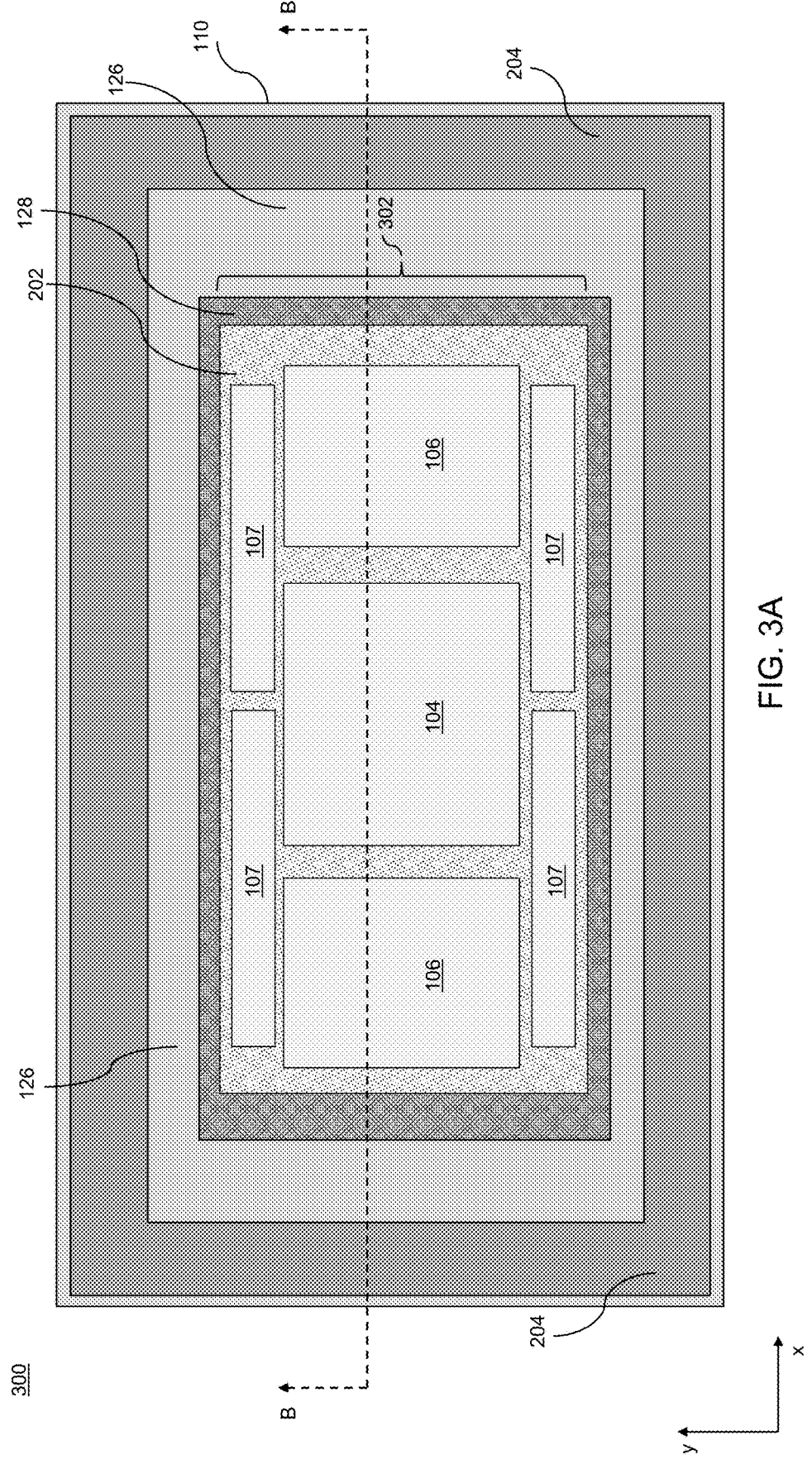
FIG. 3A is a top view of a semiconductor package including a multi-die chip, according to various embodiments.
Figure 3B:
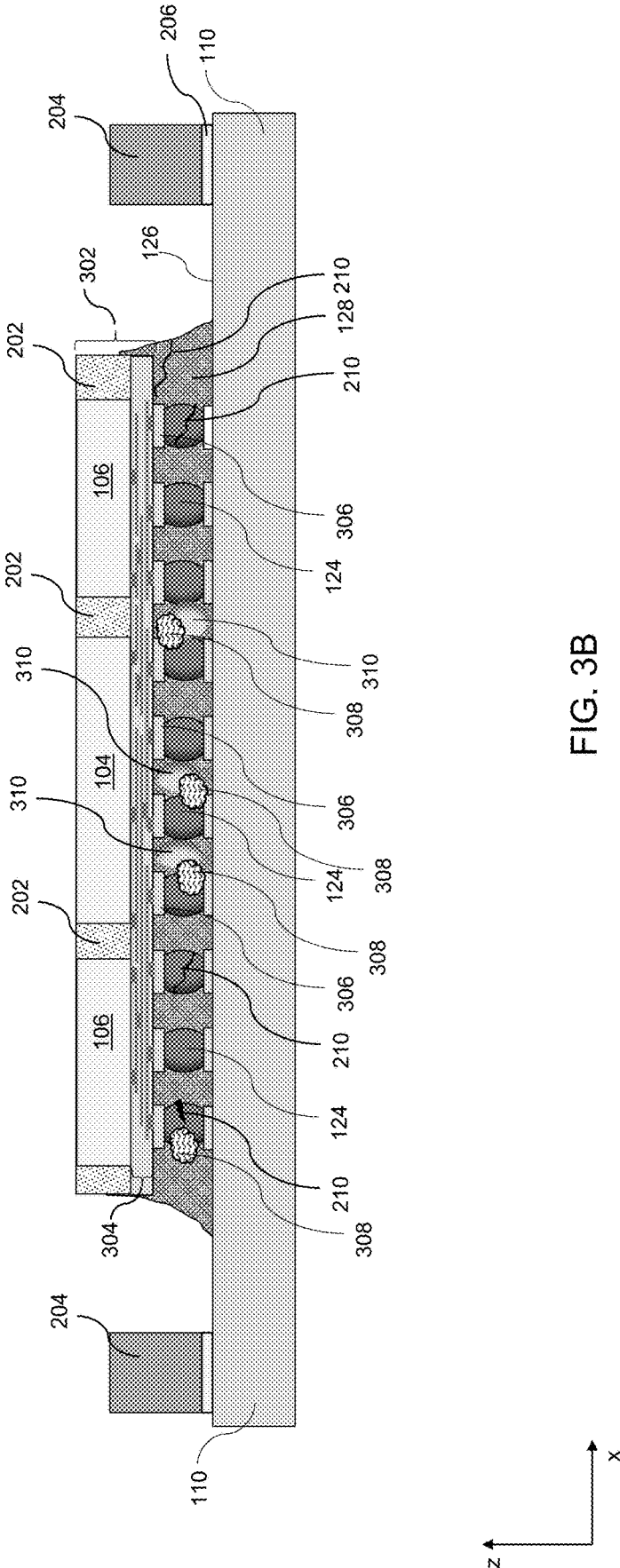
FIG. 3B is a vertical cross-sectional view of the semiconductor package of FIG. 3A, according to various embodiments.

FIG. 3A is a top view of a semiconductor package 300 including multi-die chip 302, and FIG. 3B is a vertical cross-sectional view of the semiconductor package 300 of FIG. 3A, according to various embodiments. The vertical plane that defines the cross-sectional view of FIG. 3B is indicated by the cross-section B-B' in FIG. 3A. The multi-die chip 302 die may be formed in an integrated fan-out wafer-level packaging (FOWLP) process. In this regard, a plurality of known good semiconductor dies (104, 106, 107) may be diced from a starting wafer and may be assembled on a temporary substrate to form a reconstituted wafer (not shown). A multi-die EMC frame 202 may then be formed around the plurality of semiconductor dies (104, 106, 107) to thereby embed the semiconductor dies (104, 106, 107) within the multi-die EMC frame 202. Electrical connections may then be formed over the semiconductor dies (104, 106, 107) by forming one or more redistribution layers 304 over the semiconductor dies (104, 106, 107). Electrically conductive chip bonding structures 306 (e.g., C2 bonding pillars or C4 bonding pads) may then be formed such that the multi-die chip 302 may be electrically connected to the package substrate 110 in a subsequent mounting operation. The reconstituted wafer may then be diced to generate a plurality of multi-die chips 302, which may be then electrically connected to the package substrate 110, as shown in FIG. 3B.

The above-described FOWLP process may be characterized as a "chip first" process in which the semiconductor dies (104, 106, 107) are first placed on the reconstituted wafer and the one or more redistribution layers 304 are then formed over the semiconductor dies (104, 106, 107). Alternatively, in a "chip last" process, the one or more redistribution layers 304 may be first formed on a carrier substrate in a first operation. In subsequent operations, the semiconductor dies (104, 106, 107) may then be attached to the one or more redistribution layers 304 and a multi-die EMC frame 202 may be formed around the attached semiconductor dies (104, 106, 107). In both the "chip first" and "chip last" FOWLP processes, the one or more redistribution layers 304 may have a fan-out configuration such that a pitch of electrically conductive chip bonding structures 306 is greater than a pitch of electrical connections (not shown) formed on the semiconductor dies (104, 106, 107). For example, in one embodiment, the electrical connections (not shown) formed on the semiconductor dies (104, 106, 107) may have a pad diameter that is between 55 microns and 65 microns and a pitch that is between 95 microns and 110 microns and the electrically conductive chip bonding structures 306 formed on the one or more redistribution layers 304 may have a pad diameter that is between 90 microns and 120 microns and a pitch that is between 295 microns and 305 microns. The above-described dimensions are provided merely as examples and various other dimensions may be provided in other embodiments.

As shown in FIGS. 3A and 3B, the semiconductor package 300 may include a first semiconductor die 104 and a second plurality of semiconductor dies 106. In various embodiments, the first semiconductor die 104 may be configured as a three-dimensional device, such as a three-dimensional integrated circuit (3DICs), a system-on-chip (SOC) device, or a system-on-integrated-chips (SoIC) device.

Each of the first plurality of semiconductor dies 104 may be formed by placing chips over chips on a semiconductor wafer level to form three-dimensional devices. These three-dimensional devices may provide improved integration density and other advantages, such as faster speeds and higher bandwidths, due to a decreased length of interconnects between the stacked chips. In some embodiments, each one of the first plurality of semiconductor dies 104 may also be referred to as a "first die stack." In some embodiments, each of the first plurality of semiconductor dies 104 may be dies or chips, such as logic dies, or power management dies.

In the semiconductor package 300 of FIG. 3A, the first semiconductor die 104 may include a first die stack, which may be configured as a SOC device. In various embodiments, the first semiconductor die 104 may be located in a central region of the semiconductor package 300. The second plurality of semiconductor dies 106 may be located adjacent to the first semiconductor die 104, as shown in FIG. 3A. In this example embodiment, the second plurality of semiconductor dies 106 may include two semiconductor dies. In some embodiments, the second plurality of semiconductor dies 106 may be three-dimensional IC semiconductor devices and may also be referred to as "second die stacks." In some embodiments, the second plurality of semiconductor dies 106 may each be a semiconductor memory device, such as a high bandwidth memory (HBM) device. Although the embodiment semiconductor package 300 include seven semiconductor dies (104, 106, 107) in this example, greater or fewer die stacks may be included in other semiconductor packages in other embodiments.

As shown in FIG. 3B, the one or more redistribution layers 304 may eliminate the need for a separate interposer, such as the interposer 108 of the semiconductor package 100 of FIGS. 1A and 1B, and the semiconductor package 200 of FIGS. 2A to 2C. As such, embodiment multi-die chip 302 of FIGS. 3A and 3B (i.e., a "chip first" integrated fan-out device) may also eliminate the need for the plurality of metal bumps 120 (e.g., microbumps) and the first underfill material portion 122 of the semiconductor package 100 of FIGS. 1A and 1B, and the semiconductor package 200 of FIGS. 2A to 2C. As such, the embodiment semiconductor package 300 of FIGS. 3A and 3B may mitigate cracking and other mechanical deformation/degradation that may otherwise occur (e.g., see FIG. 2C) between the semiconductor dies (104, 106), the interposer 108, and the first underfill material portion 122 (i.e., in semiconductor packages 100 and 200 of FIGS. 1A to 2C).

As shown in FIG. 3B, however, mechanical deformation/degradation may still occur between the multi-die chip 302 and the package substrate 110 in certain embodiments. In this regard, in embodiments in which the semiconductor package 300 is sufficiently large, cracks 210, delamination, and other mechanical distortions may form within the second underfill material portion 128, within the plurality of metal bumps 124, etc. Further, in large semiconductor packages such as the semiconductor package 300 of FIGS. 3A and 3B, it may be difficult to remove flux 308 residue that is used in a reflow operation to reflow the plurality of metal bumps 124 to thereby attach the multi-die chip 302 to the package substrate. As such, a flux cleaning operation may not be completely effective and may therefore leave various portions of flux 308 residue. Similarly, in large semiconductor packages, a process of forming the second underfill material portion 128 may not be fully effective, due to limited capillary flow, and may therefore leave various voids 310 in the second underfill material portion 128. Various disclosed embodiments may include a hybrid underfill structure that may mitigate issues related to crack 210, void 310, and flux 308 residue formation between the multi-die chip 302 and the package substrate 110, as described in greater detail with reference to FIGS. 4A and 4B, below.

Figure 4A:
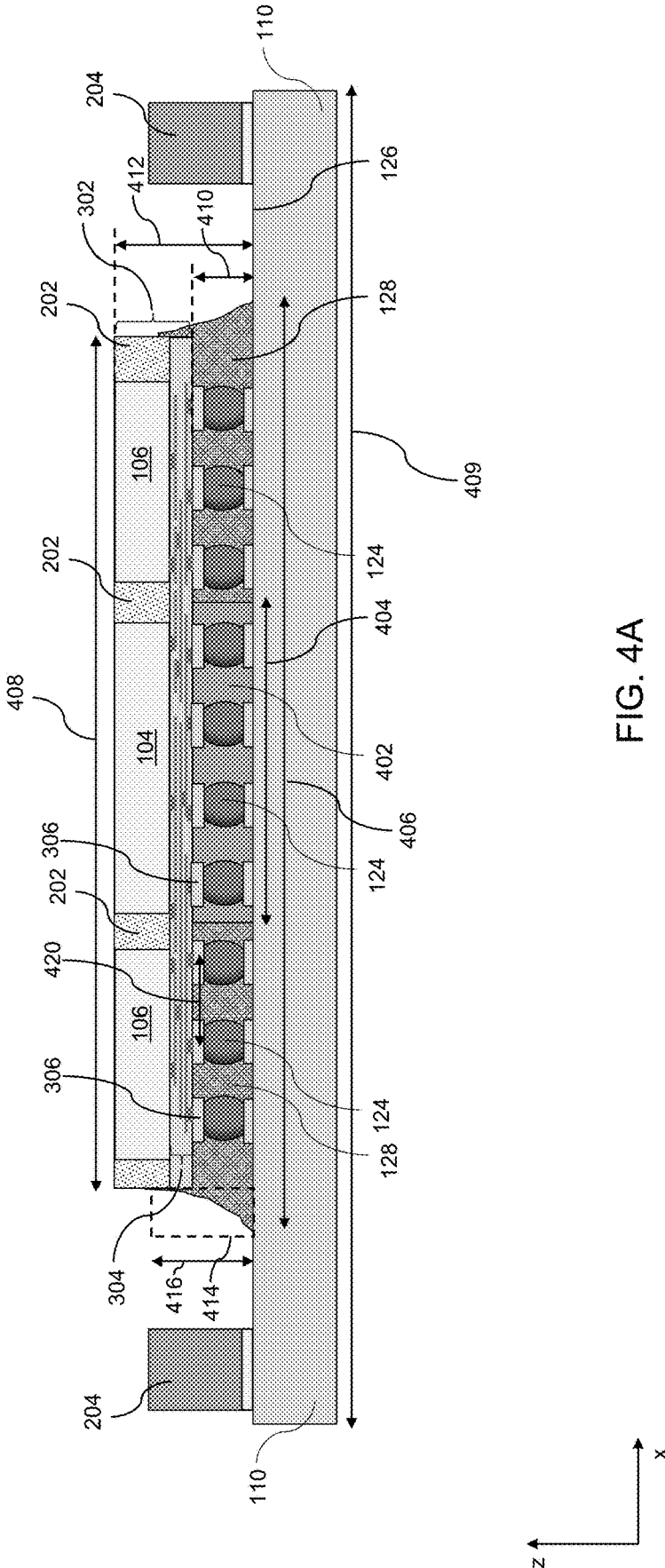
FIG. 4A is a vertical cross-section view of a further semiconductor package including a multi-die chip and a hybrid underfill structure, according to various embodiments.
Figure 4B:
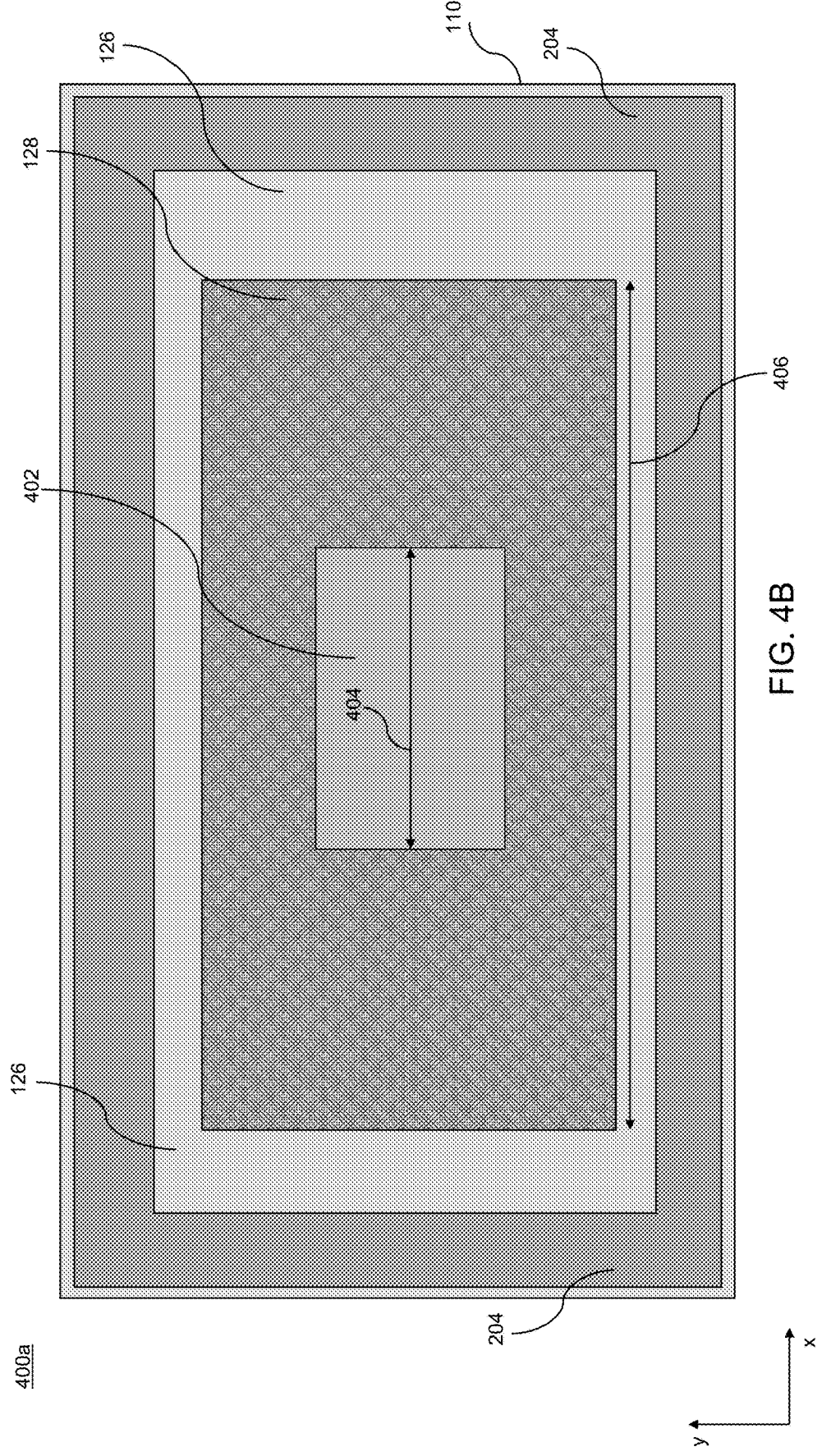
FIG. 4B is a top view of the semiconductor package of FIG. 4A with the multi-die chip removed to illustrate details of the hybrid underfill structure, according to various embodiments.

FIG. 4A is a vertical cross-section view of a further semiconductor package 400a including a multi-die chip 302 and a hybrid underfill structure, according to various embodiments. FIG. 4B is a top view of the semiconductor package of FIG. 4A with the multi-die chip 302 removed to illustrate details of the hybrid underfill structure, according to various embodiments. The vertical plane that defines the cross-sectional view of FIG. 4A is similar to that indicated by the cross section B-B' in FIG. 3A in the context of the above-described semiconductor package 300 of FIGS. 3A and 3B. As shown in FIG. 4A, the semiconductor package 400a may include a package substrate 110 and the multi-die chip 302 attached to the package substrate 110. The multi-die chip 302 may be formed in a FOWLP process, as described above with reference to FIGS. 3A and 3B.

As shown in FIGS. 4A and 4B, the hybrid underfill structure may include a non-conductive film 402 formed in a first region between the multi-die chip 302 and the package substrate 110 and a capillary underfill material (e.g., second underfill material portion 128) formed in a second region between the multi-die chip 302 and the package substrate 110. Each of the non-conductive film 402 and the capillary underfill material 128 may be thermally curable polymer based materials that may or may not include filler materials (e.g., silica or glass fillers). As shown in FIG. 4B, the second region (containing the capillary underfill material 128) may surround the first region (containing the non-conductive film 402) in a plan view. Also, as shown in FIGS. 4A and 4B, the first region containing the non-conductive film 402 may have a first width 404 and the second region containing the capillary underfill material 128 may have a second width 406. As shown, the first width 404 may be smaller than the second width 406. In certain embodiments, the second width 406 may be at least 20% greater than the first width 404. For example, the second width 406 may be 10% to 100% greater than the first width 404. In further embodiments, the capillary underfill material 128 may have a second area that is at least 50% greater than that of the non-conductive film 402. For example, the capillary underfill material 128 may have a second area that is 25% to 300% greater than that of the non-conductive film 402.

In some embodiments, the multi-die chip 302 may include a chip width 408 that is less than the second width 406, as shown in FIG. 4A. In certain embodiments the chip width 408 may be greater than or equal to 50 mm (but smaller than 75 mm) and the package substrate may have a package width 409 that is greater than or equal to 72 mm (but smaller than 108 mm). Also, as shown in FIG. 4A, the semiconductor package 400a may further include a first separation distance 410 between a bottom surface of the multi-die chip 302 and a surface 126 of the package substrate 110, and a second separation distance 412 between a top surface of the multi-die chip 302 and the surface 126 of the package substrate 110. The capillary underfill material 128 may include an underfill fillet 414 that contacts, and extends laterally beyond, side edges of the multi-die chip 302 and contacts a portion of the top surface 126 of the package substrate 110. As shown in FIG. 4A, the underfill fillet 414 may include a fillet height 416 that is greater than the first separation distance 410 and is less than the second separation distance 412. The multi-die chip 302 may include electrically conductive chip bonding structures 306 having a pitch 420 that is less than or equal to 300 microns.

In various embodiments, capillary underfill material 128 may have a first modulus that is greater than 10 GPa at 25°

C. and the non-conductive film 402 may include a second modulus that is less than 10 GPa at 25° C. For example, the modulus of non-conductive film 402 may be in a range from 5 GPa to 9 GPa. The relationship between the modulus for the capillary underfill material 128 and that of the non-conductive film 402 (i.e., capillary underfill material 128 having a greater modulus than the non-conductive film 402) may provide improved reliability in terms of reduced mechanical deformation/damage induced by thermal cycling. In some embodiments, the non-conductive film 402 may have a first glass temperature and the capillary underfill material 128 may have a second glass temperature, such that each of the first glass temperature and the second glass temperature are greater than 100° C. In some embodiments, the non-conductive film 402 may have a first coefficient of thermal expansion that is greater than 20 ppm/° C. at temperatures below the first glass temperature and the capillary underfill material 128 may have a second coefficient of thermal expansion that is greater than 20 ppm/° C. at temperatures below the second glass temperature.

Figure 4C:
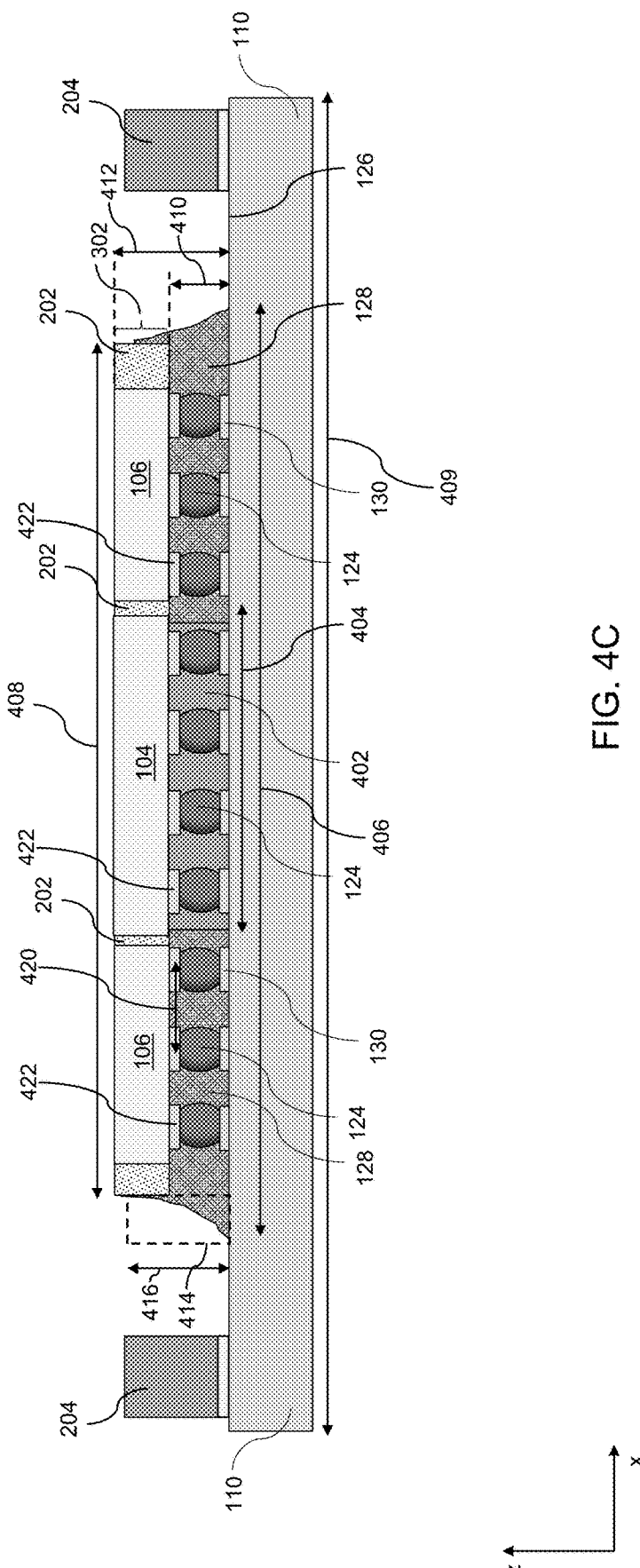
FIG. 4C is a vertical cross-section view of a further semiconductor package including a hybrid underfill structure, according to various embodiments.

FIG. 4C is a vertical cross-section view of a further semiconductor package 400c including a hybrid underfill structure, according to various embodiments. In this embodiment, electrically conductive die bonding structures 422 may have a size and spacing (i.e., pitch 420) that may be comparable to that of package bonding structures 130. In such embodiments, both the interposer 108 (e.g. FIGS. 1A to 2C) and the redistribution layer 304 (e.g., see FIGS. 3B and 4A) may be eliminated and the semiconductor dies (104, 106) may be directly connected to the package substrate 110. In this regard, the semiconductor package 400c may include a package substrate 110, a first semiconductor die 104 electrically and mechanically coupled to the package substrate 110 and a second semiconductor die 106 electrically and mechanically coupled to the package substrate 110. As with the embodiment (300, 400a) of FIGS. 3A to 4B, the hybrid underfill structure may include a non-conductive film 402 formed between the first semiconductor die 104 and the package substrate 110 and a capillary underfill material 128 formed between the second semiconductor die 106 and the package substrate 110. As shown in FIGS. 4B and 4C, the non-conductive film 402 may be formed in a first region over a surface 126 of the package substrate 110 and the capillary underfill material 128 may be formed over a second region of the surface of the package substrate such that the second region surrounds the first region in a plan view (e.g., see FIG. 4B).

As shown in FIG. 4C, semiconductor package 400c may include one or more additional second semiconductor dies 106 (e.g., two second semiconductor dies 106 in FIG. 4C) located in the second region such that the capillary underfill material 128 is disposed between the one or more additional second semiconductor dies 106 and the package substrate 110. As shown in FIG. 4C, the non-conductive film 402 may have a first width 404 and the capillary underfill material 128 may have a second width 406 such that the second width 406 is at least 20% greater than the first width 404. For example, the second width 406 may be 10% to 100% greater than that of the first width 404. The non-conductive film 402 may have a first area and the capillary underfill material 128 may include a second area such that the second area is at least 50% greater than the first area. In certain embodiments, the semiconductor package 400c may further include a molding compound partially surrounding the first semiconductor die 104 and the second semiconductor die 106 (or dies 106) forming a multi-die frame 202 such that a multi-die chip 302 is formed that may include the first semiconductor die 104, the second semiconductor die 106 (or dies 106), and the multi-die frame 202, as shown in FIG. 4C.

As shown in FIG. 4C, the multi-die chip 302 may have a chip width 408 that is less than the second width 406. The semiconductor package 400c may further include a first separation distance 410 between a bottom surface of the multi-die chip 302 and the surface 126 of the package substrate 110, and a second separation distance 412 between a top surface of the multi-die chip 302 and the surface 126 of the package substrate 110. As in the embodiment semiconductor package 400a of FIGS. 4A and 4B, the capillary underfill material 128 may include an underfill fillet 414 that contacts, and extends laterally beyond, side edges of the multi-die chip 302 and contacts a portion of the top surface 126 of the package substrate 110. The underfill fillet 414 may have a fillet height 416 that is greater than the first separation distance 410 and is less than the second separation distance 412, as shown in FIG. 4C.

FIGS. 5A to 5H are vertical cross-sectional views of intermediate structures (500a to 500h) that may be used in the formation of a semiconductor package (400a, 400c), according to various embodiments. The intermediate structure 500a of FIG. 5A may include a package substrate 110 having package bonding structures 130. The package bonding structures 130 may be electrically connected to electrical interconnect structures (not shown) within the package substrate 110. The package bonding structures 130 may have a pad diameter 419 that is between 90 microns and 120 microns and a pitch 420 that is between 295 microns and 305 microns. The package substrate 110 may further include a plurality of metal bumps 124. For example, the plurality of metal bumps 124 may include solder portions formed over the package bonding structures 130. In this regard, the package bonding structures 130 and the plurality of metal bumps 124 may be configured as C4 bonding structures that may be used to bond a multi-die chip 302 (e.g., see FIG. 5D) to the package substrate 110, as described in greater detail with reference FIG. 5E, below. In other embodiments, the package substrate may include C2 bonding pillar structures (not shown). According to various embodiments, the package bonding structures 130 and the plurality of metal bumps 124 may have a bump height 424 that is between 90 microns and 300 microns. The above-described dimensions are provided merely as examples and various other dimensions may be provided in other embodiments.

Figures 5A, 5B:
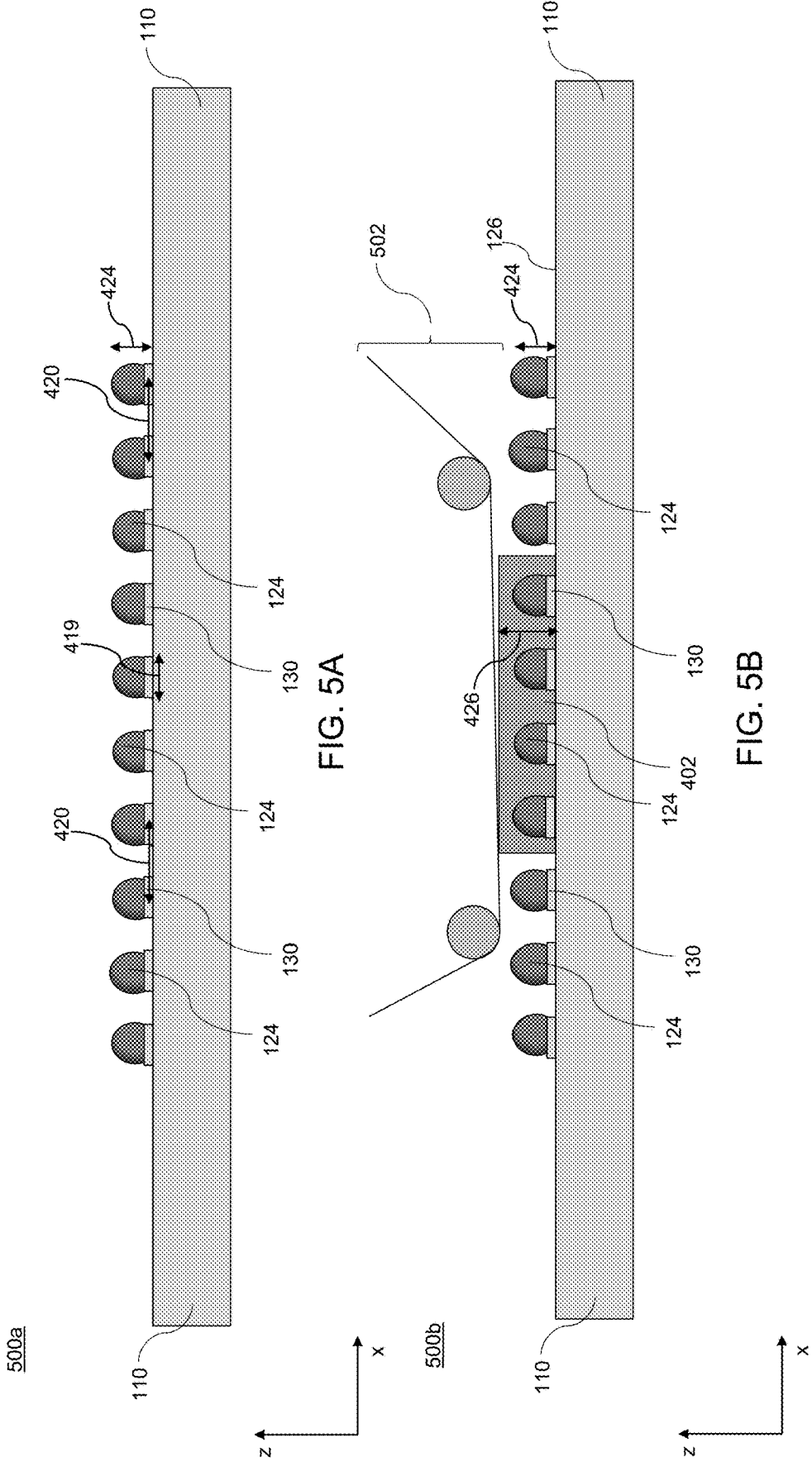
FIG. 5A is a vertical cross-sectional view of an intermediate structure that may be used in the formation of a semiconductor package, according to various embodiments.
FIG. 5B is a vertical cross-sectional view of a further intermediate structure that may be used in the formation of a semiconductor package, according to various embodiments.

FIG. 5B is a vertical cross-sectional view of a further intermediate structure 500b that may be used in the formation of a semiconductor package (400a, 400c), according to various embodiments. The intermediate structure 500b may be formed from the intermediate structure 500a of FIG. 5A by forming a non-conductive film 402 over a portion of the surface 126 of the package substrate 110. The non-conductive film 402 may be provided using a film-dispensing apparatus 502 (not drawn to scale). The non-conductive film 402 may be a polymer based material that may or may not include filler materials. In this regard, the non-conductive film 402 may be thermally curable by raising the non-conductive film 402 to an elevated temperature for a certain period of time. In various embodiments, the non-conductive film 402 may be a mixture of epoxy resin, hardener, fillers, additives, and a flux material. For example, according to one embodiment, the non-conductive film 402 may be an epoxy based thermosetting material containing nano-scale silica filler particles. Various other filler materials may be used on other embodiments. The non-conductive film 402 may have an initial film height 426 that may be greater than the bump height 424. For example, in some embodiments, the film height 426 may be greater than the bump height 424 by at least 10 microns.

Figure 5C:
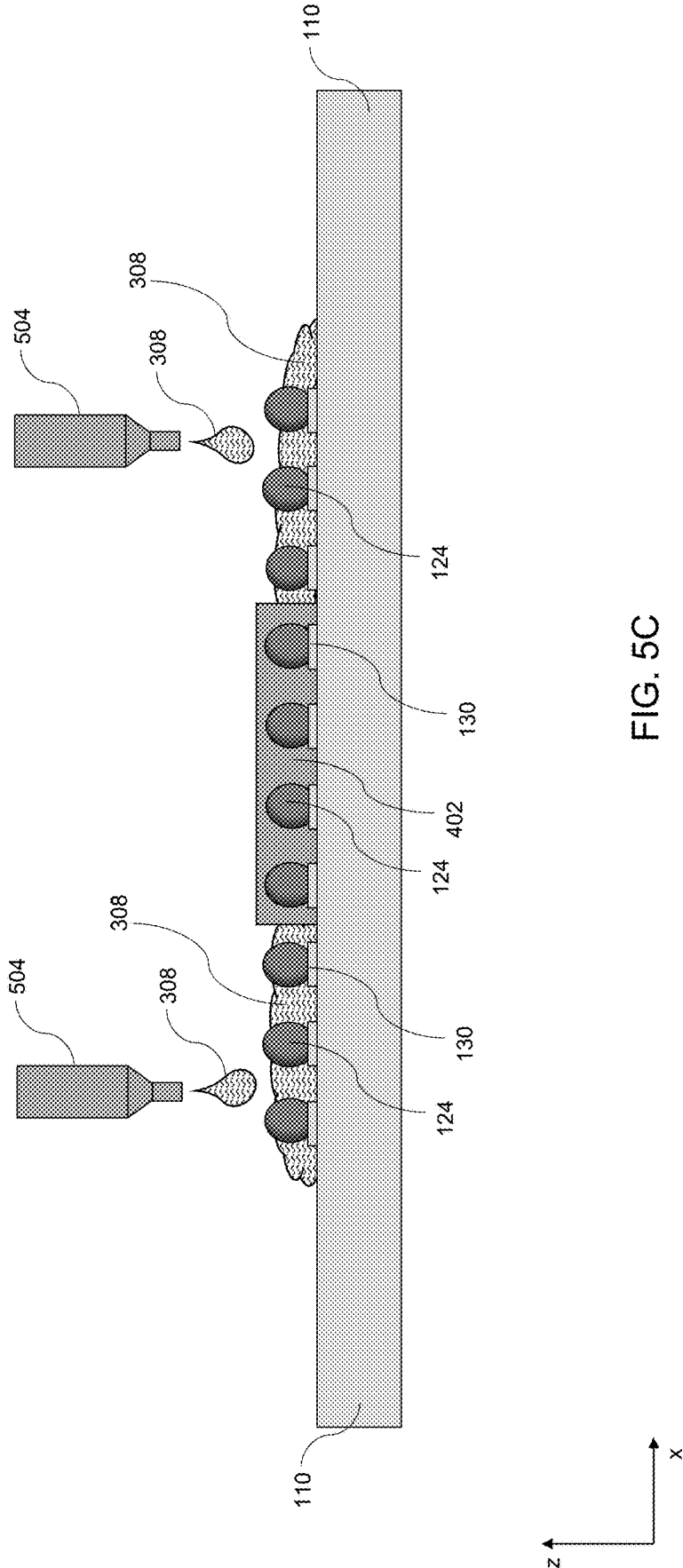
FIG. 5C is a vertical cross-sectional view of a further intermediate structure that may be used in the formation of a semiconductor package, according to various embodiments.

FIG. 5C is a vertical cross-sectional view of a further intermediate structure 500c that may be used in the formation of a semiconductor package (400a, 400c), according to various embodiments. The intermediate structure 500c may be formed from the intermediate structure 500b by forming a layer of flux 308 in the second region that surrounds the non-conductive film 402. As shown, a flux dispensing apparatus 504 may provide the flux 308 in liquid form that may flow around electrical bonding structures (124, 130) in the second region. The presence of the layer of flux 308 may remove oxide films on surfaces of the plurality of metal bumps 124 (e.g., solder bumps) and may increase a wetting ability of the plurality of metal bumps 124 to therefore form metallurgical bonds in a subsequent thermal compression bonding operation, as described in greater detail with reference to FIG. 5E, below.

Figure 5D:
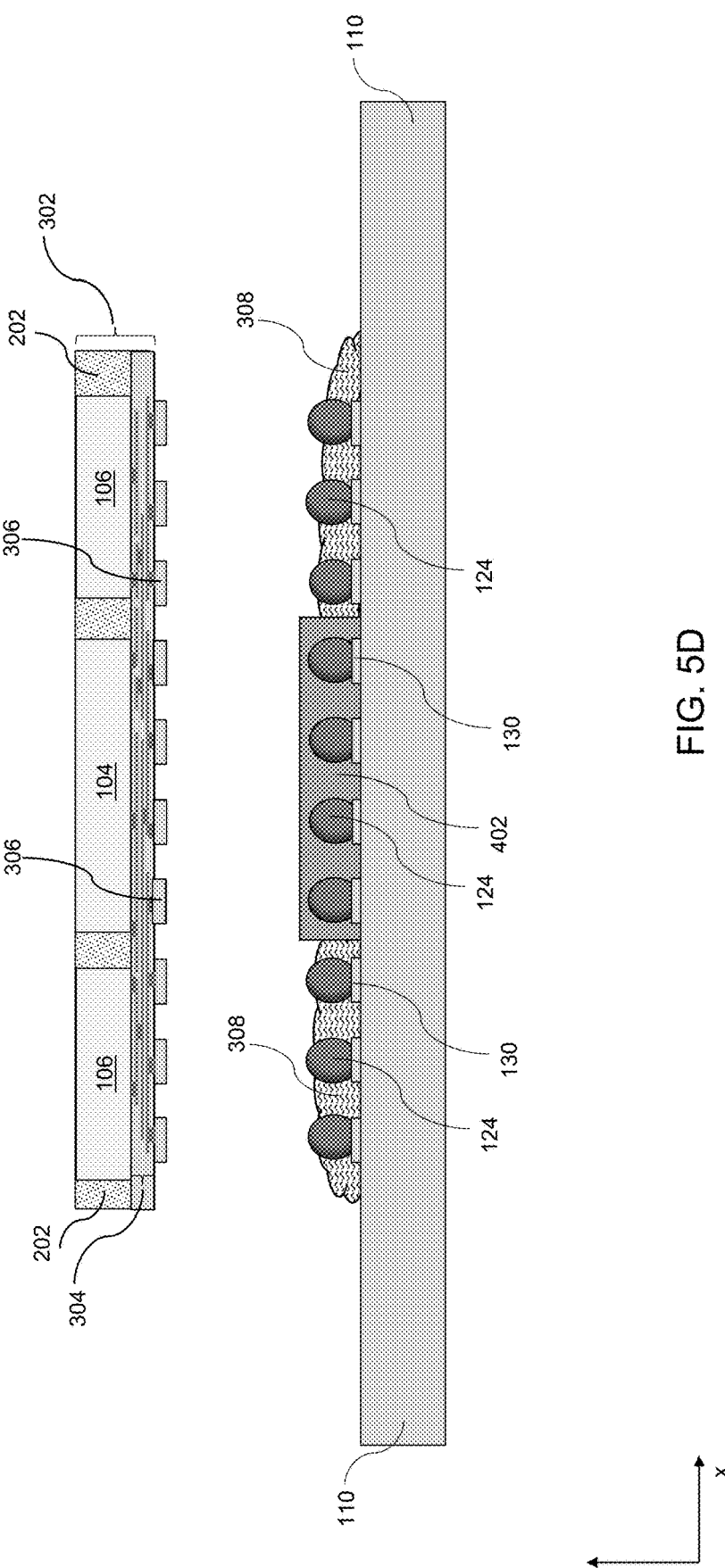
FIG. 5D is a vertical cross-sectional view of a further intermediate structure that may be used in the formation of a semiconductor package, according to various embodiments.

FIG. 5D is a vertical cross-sectional view of a further intermediate structure 500d that may be used in the formation of a semiconductor package (400a, 400c), according to various embodiments. In this regard, a multi-die chip 302 may be positioned over the intermediate structure 500c to thereby form the intermediate structure 500d. As described above, the multi-die chip 302 may include a first semiconductor die 104 and one or more second semiconductor dies 106. The first semiconductor die 104 and the one or more second semiconductor dies 106 may be embedded in a multi-die frame 202 and one or more redistribution layers 304 may be formed over the first semiconductor die 104 and the one or more second semiconductor dies 106. In this regard, the multi-die chip 302 may be formed in a FOWLP process as described above. The multi-die chip 302 may further include electrically conductive chip bonding structures 306 that may be electrically connected to interconnect structures formed within the one or more redistribution layers 304. The multi-die chip 302 may be positioned such that the electrically conductive chip bonding structures 306 are aligned with respective ones of the plurality of metal bumps 124 formed on the package substrate 110. In a subsequent bonding operation, the multi-die chip 302 may be positioned such that the electrically conductive chip bonding structures 306 are placed in direct contact with the plurality of metal bumps 124. A thermal compression bonding operation may then be performed to bond the multi-die chip 302 electrically and mechanically to the package substrate 110, as described in greater detail with reference to FIG. 5E, below.

Figure 5E:
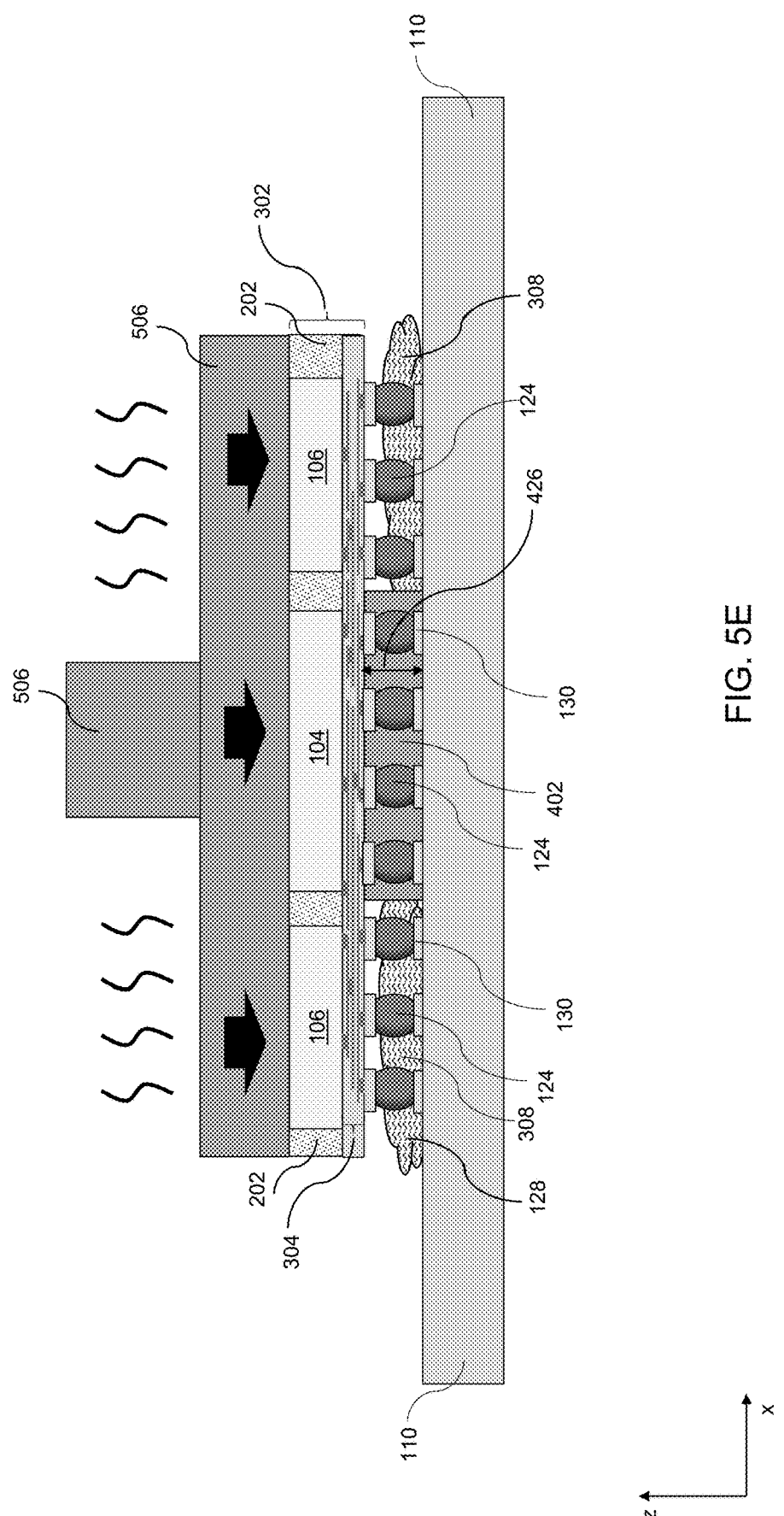
FIG. 5E is a vertical cross-sectional view of a further intermediate structure that may be used in the formation of a semiconductor package, according to various embodiments.

FIG. 5E is a vertical cross-sectional view of a further intermediate structure 500e that may be used in the formation of a semiconductor package (400a, 400c), according to various embodiments. The intermediate structure 500e of FIG. 5E may be formed from the intermediate structure 500d of FIG. 5D by subjecting the intermediate structure 500d to a thermal compression bonding operation. In this regard, a thermal compression bonding head 506 may be brought into contact with the multi-die chip 302 that has been positioned over the package substrate 110. The thermal compression bonding head 506 may provide heat to the multi-die chip 302 and may introduce compressive forces. For example, the thermal compression bonding head 506 may provide heat to raise a temperature of the intermediate structure 500e to a range between 230° C. and 400° C. The thermal compression bonding head 506 may also impart a force to the multi-die chip 302 that may be in a range from 0.1 N to 30 N. The temperature may be increased to above the melting temperature of the plurality of metal bumps 124 to thereby melt the plurality of metal bumps 124. The intermediate structure 500e may be held at an elevated temperature for a certain period of time. For example, the elevated temperature may be maintained for 60 seconds or less. The plurality of metal bumps 124 may then re-solidify upon cooling to therefore form metallurgical bonds between the multi-die chip 302 and the package substrate 110. At the completion of the thermal compression bonding operation, the non-conductive film 402 may have a thickness from 60 microns to 90 microns.

Figure 5F:
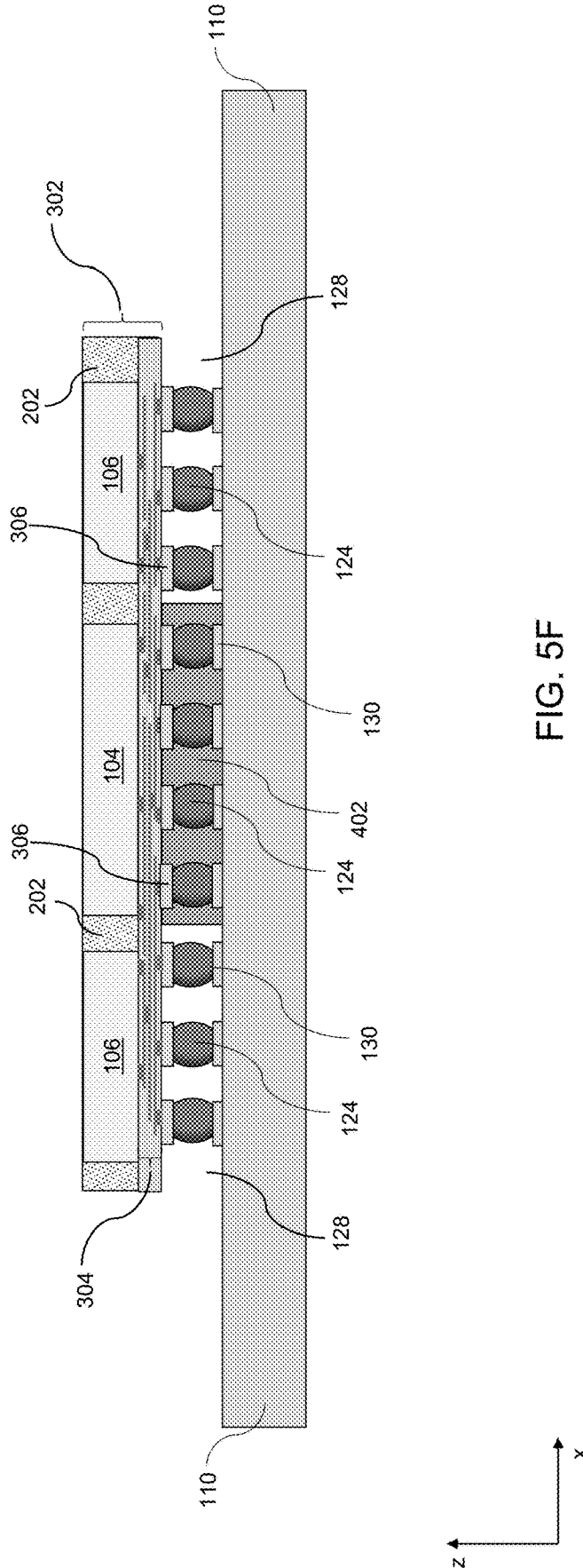
FIG. 5F is a vertical cross-sectional view of a further intermediate structure that may be used in the formation of a semiconductor package, according to various embodiments.

FIG. 5F is a vertical cross-sectional view of a further intermediate structure 500f that may be used in the formation of a semiconductor package (400a, 400c), according to various embodiments. The intermediate structure 500f of FIG. 5F may be formed from the intermediate structure 500e of FIG. 5E by removing the thermal compression bonding head 506 and by performing a flux cleaning operation to remove flux 308 (e.g., see FIG. 5E) from the second region surrounding the non-conductive film 402. In this regard, intermediate structure 500f may be held at a temperature in a range between 70° C. and 90° C. and a solvent may be introduced to remove the flux 308. Various solvents may be used depending on the chemical composition of the flux 308. For example, when using rosin based flux 308 a chlorofluorocarbon solvent may be used to break down and remove the remaining flux 308. Alternatively, a water-based flux 308 may be cleaned with various types of cleaning solutions. In certain embodiments, a no-clean flux 308, that does not require cleaning, may be used.

Figure 5G:
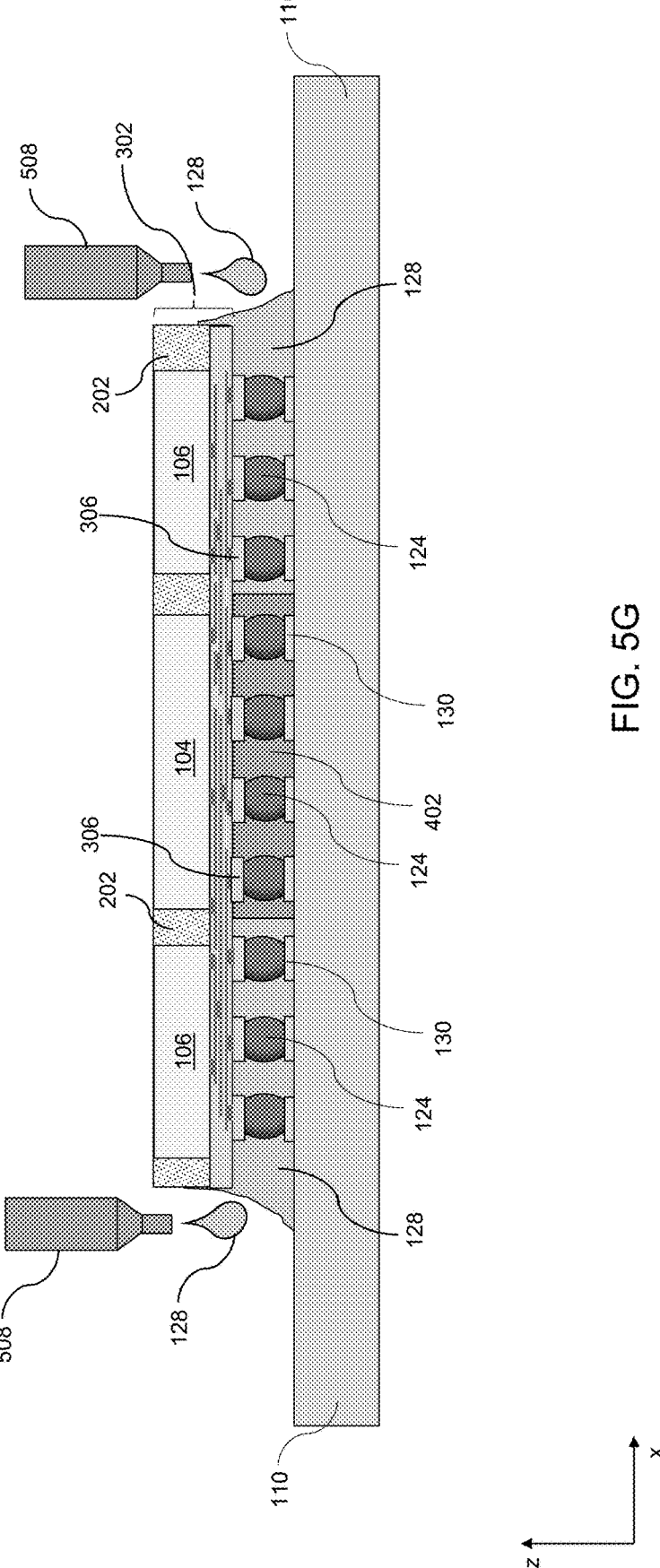
FIG. 5G is a vertical cross-sectional view of a further intermediate structure that may be used in the formation of a semiconductor package, according to various embodiments.

FIG. 5G is a vertical cross-sectional view of a further intermediate structure 500g that may be used in the formation of a semiconductor package (400a, 400c), according to various embodiments. The intermediate structure 500g of FIG. 5G may be formed from the intermediate structure 500f of FIG. 5F by introducing a capillary underfill material 128 into spaces surrounding the non-conductive film 402. In this regard, the intermediate structure 500g and a capillary underfill material dispenser 508 may be held at a temperature between 70° C. and 90° C. while the capillary underfill material 128 is dispensed in liquid form. The capillary underfill material 128 may be a mixture of epoxy resin, a hardener, one or more additives, and/or filler materials. The capillary underfill material 128 may be drawn into a space between the multi-die chip 302 and the package substrate 110 by capillary forces. The capillary underfill material 128 may then be cured when subjected to a heat treatment, as described in greater detail with reference to FIG. 5H, below.

Figure 5H:
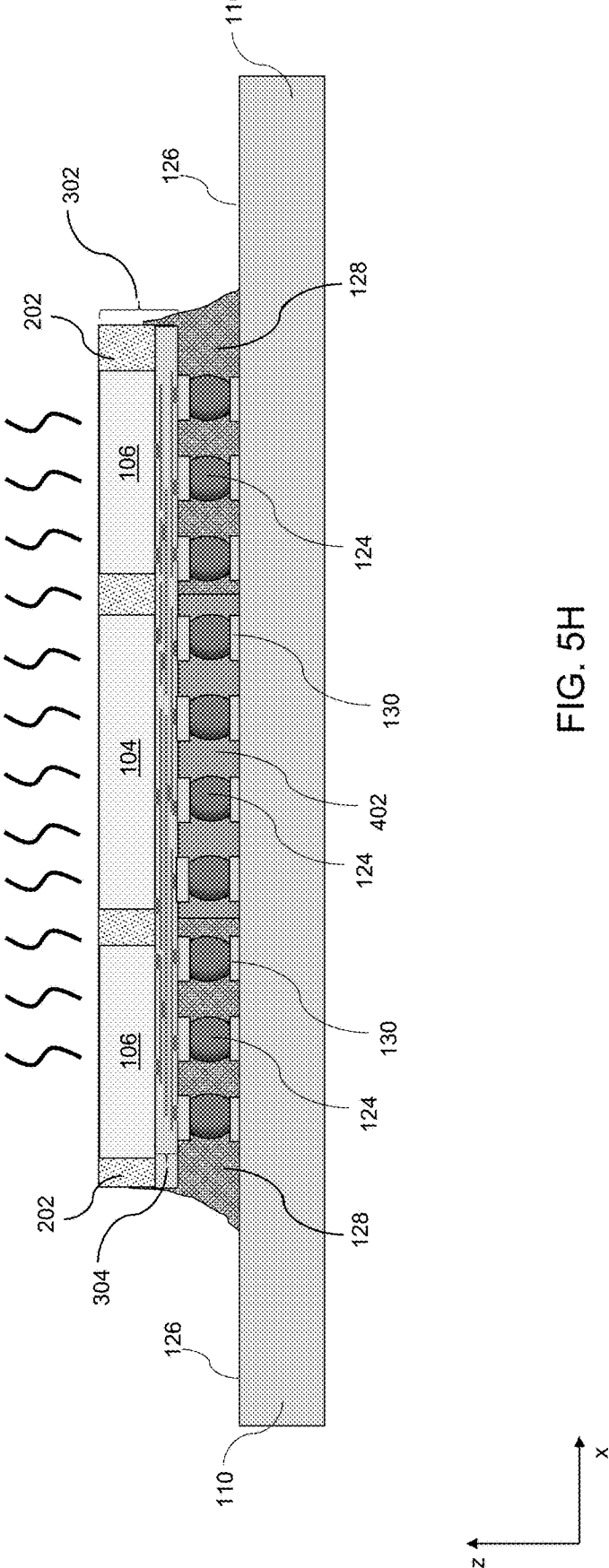
FIG. 5H is a vertical cross-sectional view of a further intermediate structure that may be used in the formation of a semiconductor package, according to various embodiments.

FIG. 5H is a vertical cross-sectional view of a further intermediate structure 500h that may be used in the formation of a semiconductor package (400a, 400c), according to various embodiments. The intermediate structure 500h of FIG. 5H may be formed from the intermediate structure 500g of FIG. 5G by subjecting the non-conductive film 402 and the capillary underfill material 128 to a heat treatment. For example, the intermediate structure 500h may be heated to a temperature between 130° C. and 170° C. for a time duration of between 60 minutes to 120 minutes. The heat treatment may thereby cause curing of the non-conductive film 402 and the capillary underfill material 128. Upon cooling, the cured capillary underfill material 128 may then have a modulus that is greater than 10 GPa at 25° C. and the non-conductive film 402 may have a modulus that is less than 10 GPa at 25° C. The relatively greater modulus of the capillary underfill material 128 may strengthen bonding structures near outer edges and corners of the multi-die chip 302, while the relatively lower modulus of the non-conductive film 402 may allow a certain degree of elastic deformation to reduce thermal expansion-induced stresses/strains. The semiconductor package 400a of FIG. 4A may then be formed from the intermediate structure 500h of FIG. 5H by attaching an external reinforcement structure 204 to the surface 126 of the package substrate 110. In other embodiments, the semiconductor package 400c of FIG. 4C may be formed using similar processing operations as described above with reference to FIGS. 5A to 5H, with the exception of using a multi-die chip 302 that does not include the one or more redistribution layers 304 (e.g., see FIG. 4A).

FIG. 6 is a flowchart illustrating various operations of a method 600 of forming a semiconductor package (400a, 400c), according to various embodiments. In operation 602, the method 600 may include forming a non-conductive film 402 over a first region of a package substrate 110 (e.g., see FIG. 4B). In operation 604, the method 600 may include attaching a first semiconductor die 104 to the package substrate 110 over the first region such that the non-conductive film 402 is disposed between the package substrate 110 and the first semiconductor die 104. In operation 606, the method 600 may include attaching a second semiconductor die 106 to a second region of the package substrate 110 (e.g., see FIG. 4B). In operation 608, the method 600 may include forming a capillary underfill material 128 between the second semiconductor die 106 and the package substrate 110.

According to the method 600, operation 604 of attaching the first semiconductor die 104, and operation 606 of attaching the second semiconductor die 106, to the package substrate 110, may further include placing the first semiconductor die 104 over the first region of the package substrate 110, placing the second semiconductor die 106 over the second region of the package substrate 110, and performing a thermocompression bonding process to couple the first semiconductor die 104 and the second semiconductor die 106 electrically and mechanically to the package substrate 110. According to the method 600, operation 606 of attaching the second semiconductor die 106 to the second region of the package substrate 110 further may include dispensing flux 308 over electrical bonding structures (124, 130) located in the second region of the package substrate 110 prior to performing the thermocompression bonding process described with reference to FIG. 5E.

The method 600 may further include performing a flux 308 cleaning operation after performing the thermocompression bonding process and prior to forming the capillary underfill material 128 between the second semiconductor die 106 and the package substrate 110. The method 600 may further include forming the first semiconductor die 104 and the second semiconductor die 106 as a multi-die chip 302 including a chip width 408 that is greater than or equal to 50 mm and forming electrically conductive chip bonding structures 306 having a pitch 420 that is less than or equal to 300 microns. The method 600 may further include attaching the multi-die chip 302 to the package substrate 110, which has a package width 409 that is greater than or equal to 72 mm. The method 600 may further include forming the capillary underfill material 128 in the second region to have a second width 406 that is at least 20% greater than a first width 404 of the non-conductive film 402 in the first region. The method 600 may further include forming the capillary underfill material 128 in the second region to have a second area that is at least 50% greater than a first area of the non-conductive film 402 in the first region.

Referring to all drawings and according to various embodiments of the present disclosure, a semiconductor package (400a, 400c) is provided. The semiconductor package (400a, 400c) may include a package substrate 110, a first semiconductor die 104 electrically and mechanically coupled to the package substrate 110, a second semiconductor die 106 electrically and mechanically coupled to the package substrate 110, a non-conductive film 402 formed between the first semiconductor die 104 and the package substrate 110, and a capillary underfill material 128 formed between the second semiconductor die 106 and the package substrate 110. In certain embodiments, the non-conductive film 402 may be formed in a first region over a surface 126 of the package substrate 110 and the capillary underfill material 128 may be formed over a second region of the surface 126 of the package substrate 110 (e.g., see FIG. 4B). Further, in various embodiments, the second region may surround the first region in a plan view (e.g., see FIG. 4B).

In various embodiments, the semiconductor package (400a, 400c) may further include one or more additional second semiconductor dies 106 located in the second region such that the capillary underfill material 128 is disposed between the one or more additional second semiconductor dies 106 and the package substrate 110. In some embodiments, the capillary underfill material 128 may have a first modulus that is greater than 10 GPa at 25° C. and the non-conductive film 402 may have a second modulus that is less than 10 GPa at 25° C. In some embodiments, the non-conductive film 402 may have a first glass temperature and the capillary underfill material 128 may have a second glass temperature such that each of the first glass temperature and the second glass temperature are greater than 100° C.

In various embodiments, the non-conductive film 402 may have a first coefficient of thermal expansion that is greater than 20 ppm/° C. at temperatures below the first glass temperature and the capillary underfill material 128 may have a second coefficient of thermal expansion that is greater than 20 ppm/° C. at temperatures below the second glass temperature. In some embodiments, the non-conductive film 402 may have a first width 404 and the capillary underfill material 128 may have a second width 406 such that the second width 406 is at least 20% greater than the first width 404. Similarly, the non-conductive film 402 may have a first area and the capillary underfill material 128 may have a second area such that the second area is at least 50% greater than the first area. In some embodiments, the semiconductor package (400a, 400c) may further include a molding compound partially surrounding the first semiconductor die 104 and the second semiconductor die 106 forming a multi-die frame 202 such that a multi-die chip 302 is formed that may include the first semiconductor die 104, the second semiconductor die 106, and the multi-die frame 202. The multi-die chip 302 may have a chip width 408 that is less than the second width 406 (e.g., see FIGS. 4A and 4C).

In various embodiments, the semiconductor package (400a, 400c) may further have a first separation distance 410 between a bottom surface of the multi-die chip 302 and the surface 126 of the package substrate 110 and a second separation distance 412 between a top surface of the multi-die chip 302 and the surface 126 of the package substrate 110. In some embodiments, the capillary underfill material 128 may further include an underfill fillet 414 that contacts, and extends laterally beyond, side edges of the multi-die chip 302 and contacts a portion of the top surface 126 of the package substrate 110. In such embodiments, the underfill fillet 414 may have a fillet height 416 that is greater than the first separation distance 410 and is less than the second separation distance 412.

According to a further embodiment, a semiconductor package (400a, 400c) is provided. The semiconductor package (400a, 400c) may include a package substrate 110, a multi-die chip 302 attached to the package substrate 110, a non-conductive film 402 formed in a first region between the multi-die chip 302 and the package substrate 110, and a capillary underfill material 128 formed in a second region between the multi-die chip 302 and the package substrate 110. In various embodiments, the capillary underfill material 128 may surround the first region in a plan view (e.g., see FIG. 4B), the capillary underfill material 128 may have a second width 406 that is at least 20% greater than a first width 404 of the non-conductive film 402, and the capillary underfill material 128 may have a second area that is at least 50% greater than a first area of the non-conductive film 402.

In certain embodiments, the multi-die chip 302 may have a chip width 408 that is less than the second width 406. The semiconductor package (400a, 400c) may further have a first separation distance 410 between a bottom surface of the multi-die chip 302 and a surface 126 of the package substrate 110 and a second separation distance 412 between a top surface of the multi-die chip 302 and the surface 126 of the package substrate 110. Further, the capillary underfill material 128 may include an underfill fillet 414 that contacts, and extends laterally beyond, side edges of the multi-die chip 302 and contacts a portion of the top surface 126 of the package substrate 110. In such embodiments, the underfill fillet 414 may have a fillet height 416 that is greater than the first separation distance 410 and is less than the second separation distance 412. In certain embodiments, the chip width 408 may be greater than or equal to 50 mm, the multi-die chip 302 may include electrically conductive bonding structures (306, 422) having a pitch 420 that is less than or equal to 300 microns, and the package substrate 110 may have a package width 409 that is greater than or equal to 72 mm.

The various embodiments disclosed herein may provide improved methods for assembling semiconductor packages (400a, 400c) that may mitigate mechanical issues related to thermal expansion mismatch between package components that may otherwise cause warpage, cracking, delamination, etc. In this regard, disclosed embodiments provide a hybrid underfill structure that includes a non-conductive film 402 in a central region between a semiconductor die (104, 106, 302) and a package substrate 110 and a capillary underfill material 128 that surrounds the non-conductive film 402 in a plan view (e.g., see FIG. 4B). The non-conductive film 402 may be placed on a surface 126 of the package substrate 110 before the semiconductor die (104, 106, 302) is attached to the package substrate 110. The presence of the non-conductive film 402 in the central region may reduce a volume occupied by the capillary underfill material 128 in a surrounding region. Thus, a capillary-flow distance may be reduced, leading to more efficient cleaning of flux 308 residue and more efficient placement of the capillary underflow material 128. As such, the occurrence of flux 308 residue and voids 310 between the semiconductor die (104, 106) (or multi-die chip 302) and the package substrate 110 may be reduced or eliminated leading to improved device performance in terms of increased protection of electrically conductive bonding structures (130, 306, 422).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a package substrate;
a first semiconductor die electrically and mechanically coupled to the package substrate;
a second semiconductor die electrically and mechanically coupled to the package substrate;
a non-conductive film formed between the first semiconductor die and the package substrate; and
a capillary underfill material formed between the second semiconductor die and the package substrate, wherein the non-conductive film is laterally surrounded on all sides by the capillary underfill material in a plan view.

2. The semiconductor package of claim 1, wherein the non-conductive film is formed in a first region over a surface of the package substrate and the capillary underfill material is formed over a second region of the surface of the package substrate, and
wherein the second region surrounds the first region in a plan view.

3. The semiconductor package of claim 2, further comprising one or more additional second semiconductor dies located in the second region such that the capillary underfill material is disposed between the one or more additional second semiconductor dies and the package substrate.

4. The semiconductor package of claim 1, wherein the capillary underfill material comprises a first modulus that is greater than 10 GPa at 25° C., and
wherein the non-conductive film comprises a second modulus that is less than 10 GPa at 25° C.

5. The semiconductor package of claim 1, wherein the non-conductive film comprises a first glass temperature and the capillary underfill material comprises a second glass temperature, and
wherein each of the first glass temperature and the second glass temperature are greater than 100° C.

6. The semiconductor package of claim 5, wherein the non-conductive film comprises a first coefficient of thermal expansion that is greater than 20 ppm/° C. at temperatures below the first glass temperature, and
wherein the capillary underfill material comprises a second coefficient of thermal expansion that is greater than 20 ppm/° C. at temperatures below the second glass temperature.

7. The semiconductor package of claim 2, wherein the non-conductive film comprises a first width and the capillary underfill material comprises a second width, and
wherein the second width is at least 20% greater than the first width.

8. The semiconductor package of claim 2, wherein the non-conductive film comprises a first area and the capillary underfill material comprises a second area, and
wherein the second area is at least 50% greater than the first area.

9. The semiconductor package of claim 7, further comprising a molding compound partially surrounding the first semiconductor die and the second semiconductor die forming a multi-die frame such that a multi-die chip is formed that includes the first semiconductor die, the second semiconductor die, and the multi-die frame.

10. The semiconductor package of claim 9, wherein the multi-die chip comprises a chip width that is less than the second width.

11. The semiconductor package of claim 10, wherein:
the semiconductor package further comprises a first separation distance between a bottom surface of the multi-die chip and the surface of the package substrate and a second separation distance between a top surface of the multi-die chip and the surface of the package substrate,
the capillary underfill material comprises an underfill fillet that contacts, and extends laterally beyond, side edges of the multi-die chip and contacts a portion of the top surface of the package substrate; and
the underfill fillet comprises a fillet height that is greater than the first separation distance and is less than the second separation distance.

12. A semiconductor package, comprising:
a package substrate;
a multi-die chip attached to the package substrate;
a non-conductive film formed in a first region between the multi-die chip and the package substrate; and
a capillary underfill material formed in a second region between the multi-die chip and the package substrate, wherein the first region is laterally surrounded on all sides by the second region in a plan view.

13. The semiconductor package of claim 12, wherein:
the capillary underfill material surrounds the first region in a plan view;
the capillary underfill material comprises a second width that is at least 20% greater than a first width of the non-conductive film; and
the capillary underfill material comprises a second area that is at least 50% greater than a first area of the non-conductive film.

14. The semiconductor package of claim 13, wherein:
the multi-die chip comprises a chip width that is less than the second width;
the semiconductor package further comprises a first separation distance between a bottom surface of the multi-die chip and a surface of the package substrate and a second separation distance between a top surface of the multi-die chip and the surface of the package substrate;
the capillary underfill material comprises an underfill fillet that contacts, and extends laterally beyond, side edges of the multi-die chip and contacts a portion of the top surface of the package substrate; and
the underfill fillet comprises a fillet height that is greater than the first separation distance and is less than the second separation distance.

15. The semiconductor package of claim 14, wherein:
the chip width is greater than or equal to 50 mm;
the multi-die chip comprises bonding structures having a pitch that is less than or equal to 300 microns; and
the package substrate has a package width that is greater than or equal to 72 mm.

16. A method of forming a semiconductor package, comprising:
forming a non-conductive film over a first region of a package substrate;
attaching a first semiconductor die to the package substrate over the first region such that the non-conductive film is disposed between the package substrate and the first semiconductor die;
attaching a second semiconductor die to a second region of the package substrate; and
forming a capillary underfill material between the second semiconductor die and the package substrate, wherein the non-conductive film is laterally surrounded on all sides by the capillary underfill material in a plan view.

17. The method of claim 16, wherein attaching the first semiconductor die to the package substrate and attaching the second semiconductor die to the package substrate further comprises:

placing the first semiconductor die over the first region of the package substrate;

placing the second semiconductor die over the second region of the package substrate; and performing a thermocompression bonding process to couple the first semiconductor die and the second semiconductor die electrically and mechanically to the package substrate.

18. The method of claim 17, wherein attaching the second semiconductor die to the second region of the package substrate further comprises:

dispensing flux over electrical bonding structures located in the second region of the package substrate prior to performing the thermocompression bonding process; and performing a flux cleaning operation after performing the thermocompression bonding process and prior to forming the capillary underfill material between the second semiconductor die and the package substrate.

19. The method of claim 17, further comprising:

forming the first semiconductor die and the second semi-conductor die as a multi-die chip comprising a chip width that is greater than or equal to 50 mm and chip bonding structures comprising a pitch that is less than or equal to 300 microns; and attaching the multi-die chip to the package substrate that has a package width that is greater than or equal to 72 mm.

20. The method of claim 17, further comprising:

forming the capillary underfill material in the second region to have a second width that is at least 20% greater than a first width of the non-conductive film in the first region; and forming the capillary underfill material in the second region to have a second area that is at least 50% greater than a first area of the non-conductive film in the first region.

\* \* \* \* \*